(12) United States Patent
Kitazawa et al.

(10) Patent No.: US 6,333,222 B1
(45) Date of Patent: Dec. 25, 2001

(54) SEMICONDUCTOR DEVICE AND MANUFACTURING METHOD THEREOF

(75) Inventors: Masashi Kitazawa; Masayoshi Shirahata; Kazunobu Ohta, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/399,369

(22) Filed: Sep. 20, 1999

(30) Foreign Application Priority Data

Mar. 17, 1999 (JP) .................................................. 11-071700

(51) Int. Cl.[7] .............................................. H01L 21/8244
(52) U.S. Cl. ......................... 438/241; 438/291; 438/369; 438/655; 438/151; 438/153; 257/337; 257/338; 257/350; 257/351
(58) Field of Search ...................................... 257/368, 382, 257/383, 384, 389; 438/649, 652, 368, 369, 300, 241, 291, 592, 655, 239, 253

(56) References Cited

U.S. PATENT DOCUMENTS

| | | | | |
|---|---|---|---|---|
| 6,017,799 | * | 1/2000 | Chien et al. | 438/291 |
| 6,069,037 | * | 5/2000 | Liao | 438/241 |
| 6,136,677 | * | 10/2000 | Prein | 438/592 |
| 6,918,151 | * | 3/2001 | Wada | 257/520 |

FOREIGN PATENT DOCUMENTS

| | | |
|---|---|---|
| 02-240934 | 9/1990 | (JP) . |
| 10-270568 | 10/1998 | (JP) . |

* cited by examiner

*Primary Examiner*—Matthew Smith
*Assistant Examiner*—Belur Keshavan
(74) *Attorney, Agent, or Firm*—McDermott, Will & Emery

(57) ABSTRACT

In the method of manufacturing the DRAM mixed logic memory, first, a pattern of one gate electrode is formed, and then a pattern of another gate electrode is formed. A step of oxidizing a polycrystalline silicon residue is performed thereafter. Therefore, the polycrystalline silicon residue is prevented from being left and prevention of electric short circuit is allowed.

12 Claims, 20 Drawing Sheets

MEMORY CELL PORTION OF MIXED MEMORY

LOGIC PORTION OF MIXED MEMORY

MEMORY CELL PORTION OF MIXED MEMORY

LOGIC PORTION OF MIXED MEMORY

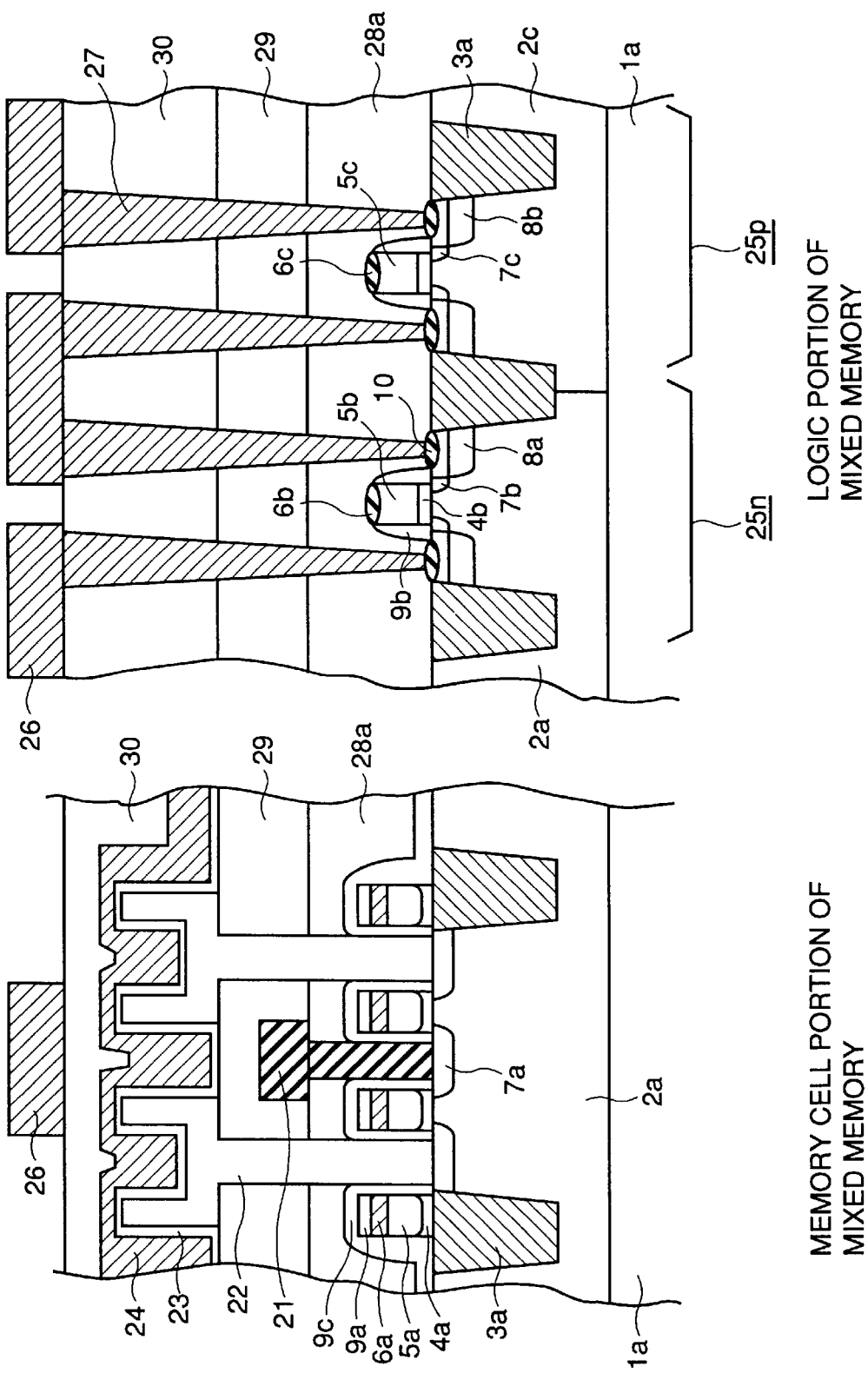

MEMORY CELL PORTION OF MIXED MEMORY

LOGIC PORTION OF MIXED MEMORY

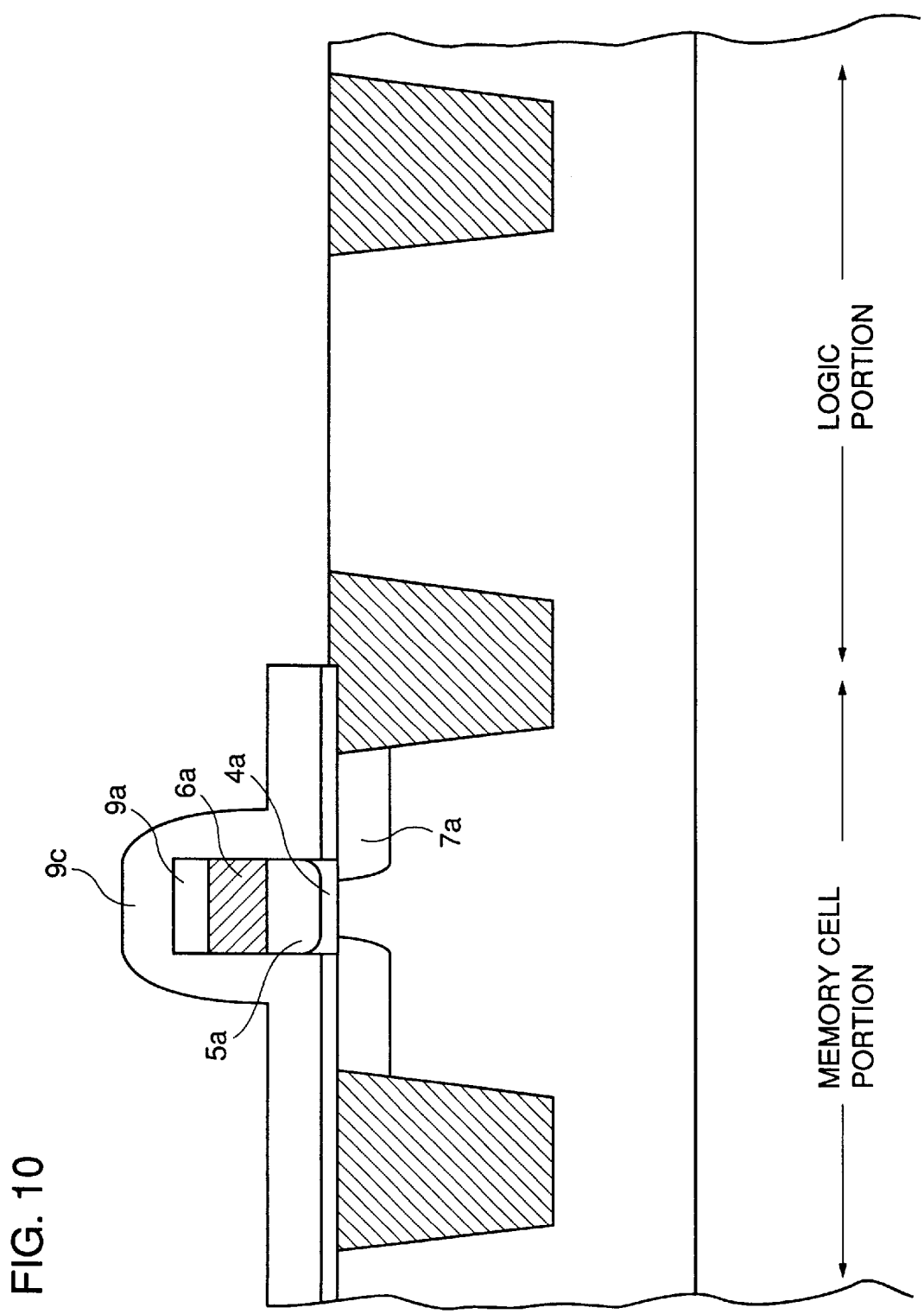

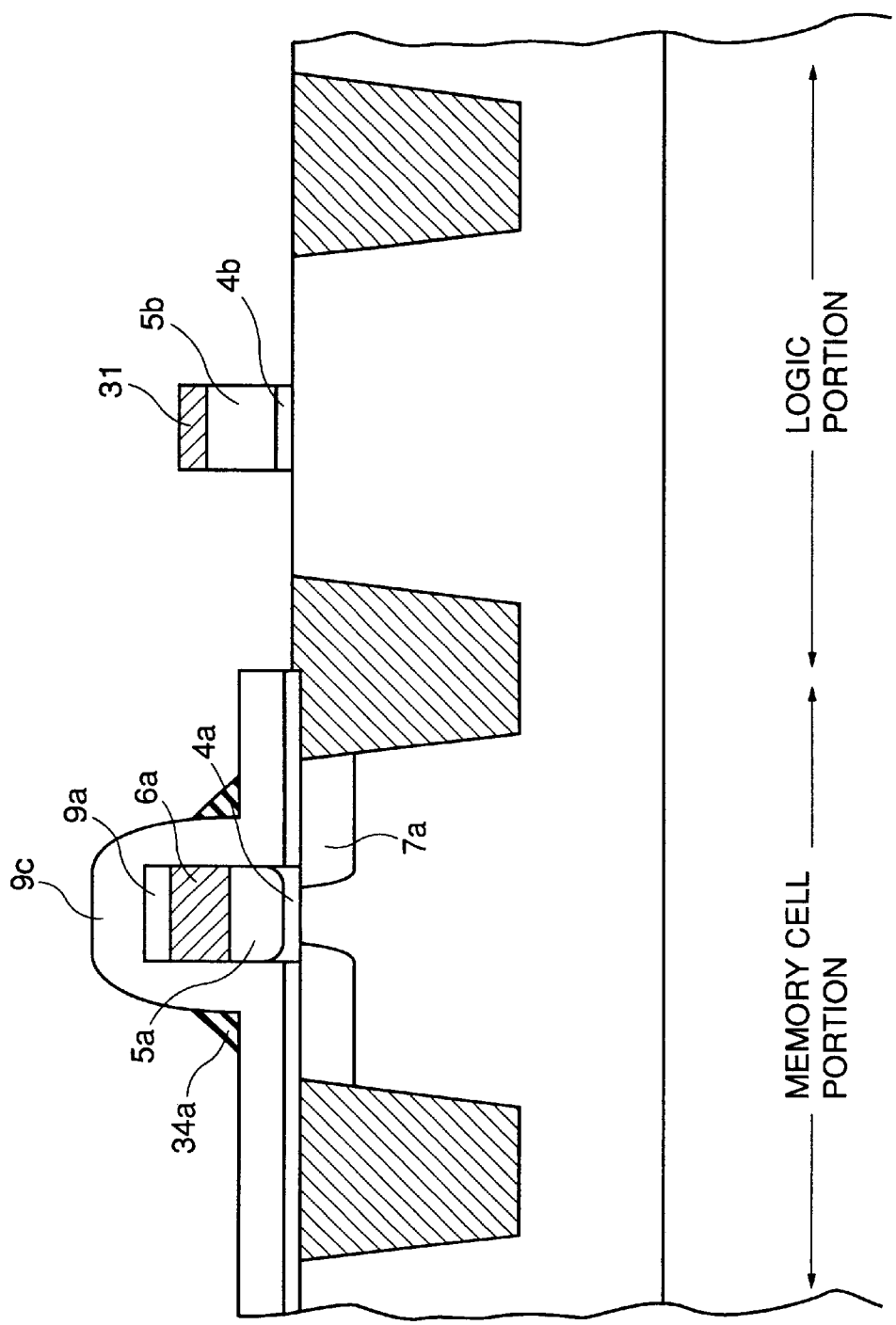

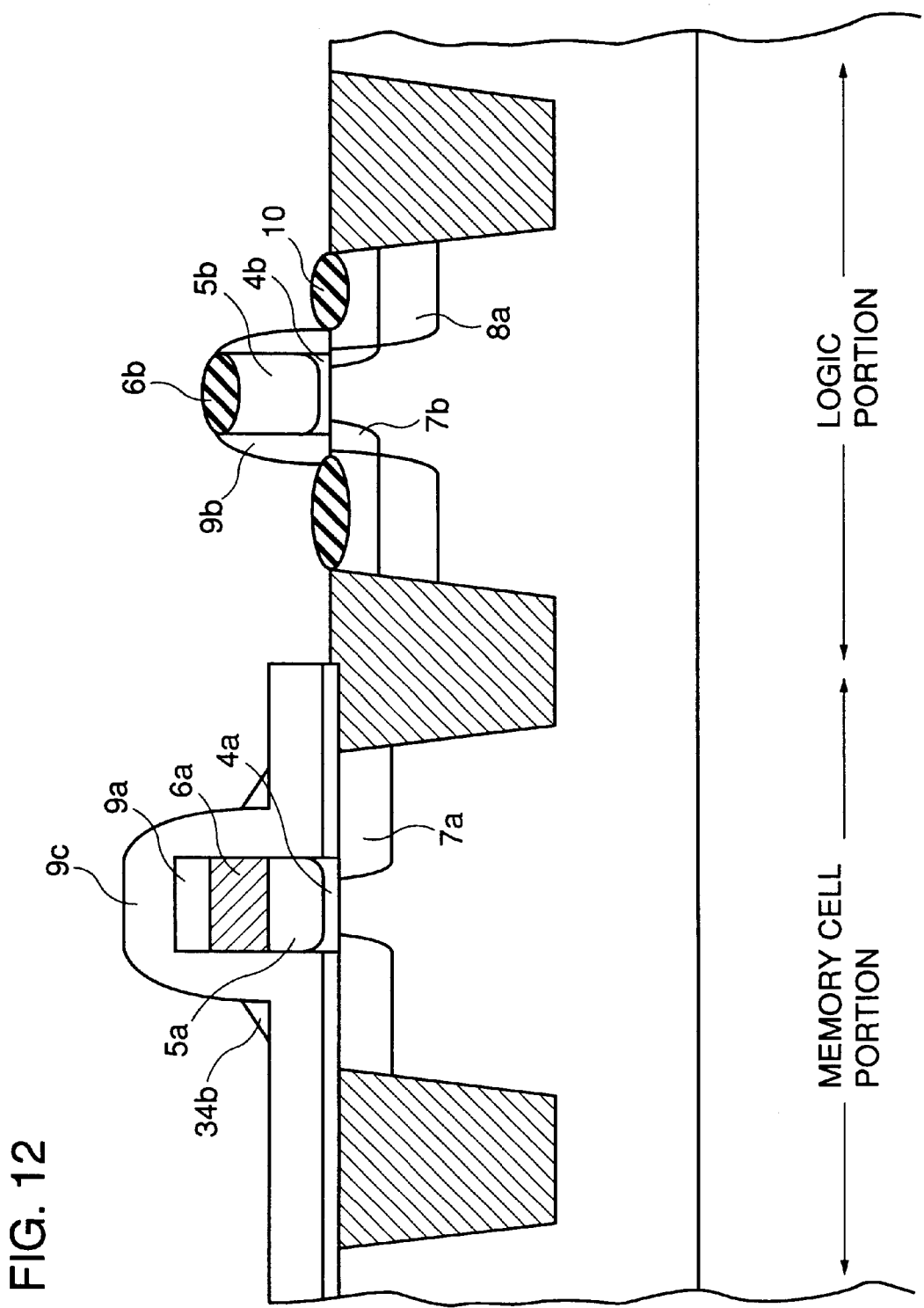

MEMORY CELL PORTION OF MIXED MEMORY

LOGIC PORTION OF MIXED MEMORY

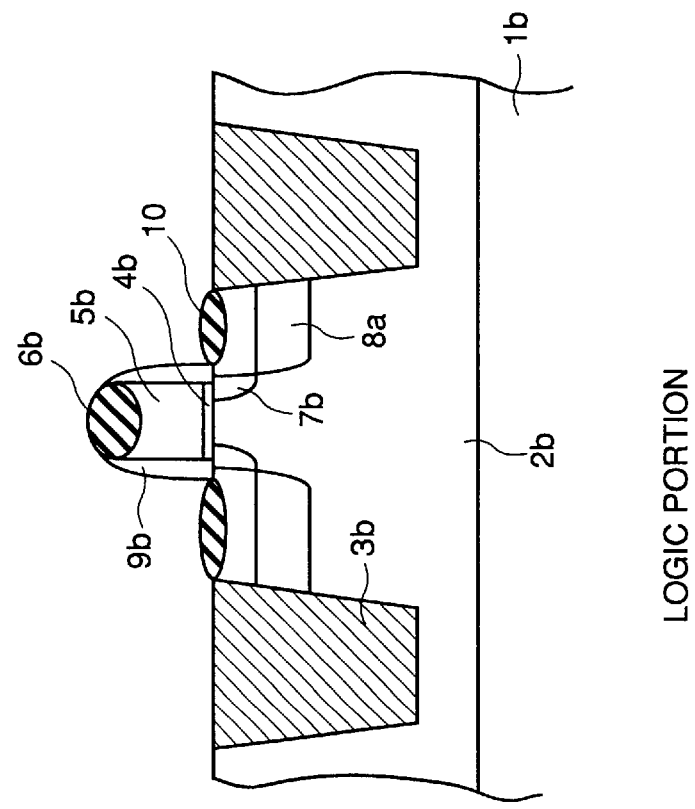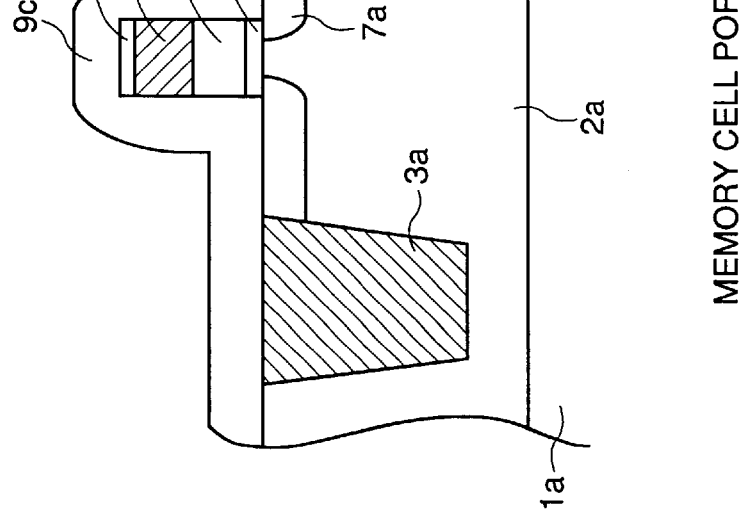
FIG. 14B PRIOR ART
FIG. 14A PRIOR ART

SEMICONDUCTOR DEVICE AND MANUFACTURING METHOD THEREOF

BACKGROUND OF THE INVENTION

1. Field of the Invention

The present invention relates to a semiconductor device having a plurality of MIS (Metal Insulator-Semiconductor) transistors with different electric characteristics and a manufacturing method thereof.

2. Description of the Background Art

As a method for improving system performance, System on Chip technology has been actively researched and developed recently. A device particularly drawing attention is a DRAM mixed logic memory device in which a memory portion with large capacity and a logic portion operating at high speed are mounted on a single chip.

In the DRAM mixed logic memory device, an MIS transistor is one of technically important key devices. Specifically, in the DRAM memory cell portion, the MIS transistor must be very small to minimize the size of the memory cell and must include an insulation film capable of enduring high voltage application to accommodate a voltage of a word line of a level higher than power supply voltage.

Conversely, in the DRAM logic portion, as high-speed operation is required, a gate electrode interconnection and source/drain active regions must have low resistance and high current driving capability.

To meet the above described conflicting requirements in the DRAM mixed logic memory device is not easy, and generally the performance of the MIS transistor in the DRAM logic portion is lowered to be equal to the performance of the MIS transistor in the DRAM memory cell portion.

FIGS. 14A and 14B show sectional structures of N type MIS transistors, respectively in the memory cell portion and the logic portion mounted on separate chips according to a conventional art.

Shown in FIGS. 14A and 14B are, a semiconductor substrate 1a, a P type well region 2a, a trench isolation region 3a, gate insulation films 4a and 4b of silicon oxide films or the like, a first polycrystalline silicon film 5a of a polycrystalline silicon film doped with an N type impurity or the like, a second polycrystalline silicon film 5b of an N type polycrystalline silicon film doped with an impurity by ion implantation after the formation of the polycrystalline silicon film, a first silicide layer 6a of a tungsten silicide (WxSiy) layer or the like, a second silicide layer 6b of a titanium silicide, (TixSiy) layer, cobalt silicide (CoxSiy) layer or the like, N− source/drain active regions 7a, an extension region 7b, N+ source/drain active regions 8a, insulation films 9a and 9c of a silicon nitride film, a silicon nitrided oxide insulation film, or the like, an insulation film 9b of a silicon nitrided oxide film, a silicon oxide film (both will be referred to as silicon oxide film hereinafter) or the like, and a third silicide layer 10 of a titanium silicide (TixSiy) layer, a cobalt silicide (CoxSiy) layer or the like formed as a silicide layer on the active region.

First polycrystalline silicon film 5a and first silicide layer 6a form a gate electrode of a first MIS transistor of the memory cell portion. Second polycrystalline silicon film 5b and second silicide layer 6b form a gate electrode of a second MIS transistor of the logic portion.

Insulation film 9c covers the gate electrode of the first MIS transistor of the memory cell portion and insulation film 9b is a sidewall.

In general, the performance of the MIS transistor is improved with a thinner gate insulation film. On the other hand, when the gate insulation film is thin, a voltage applied to the gate is lowered to guarantee the reliability. Therefore, in the memory cell portion where high voltage operation is required, thick gate insulation film 4a is formed whereas in the logic portion where maintenance of a certain level of the performance rather than the high voltage operation is required, thin gate insulation film 4b is formed.

In addition, as the logic portion rather than the memory cell portion must operate at fast speed, a material employed in a silicide has a lower sheet resistance at an electrode interconnection in the logic portion than in the memory cell portion. Additionally, the active region is formed of a silicide to suppress the delay of the transistor operation caused by parasitic resistance.

With reference to FIGS. 15A and 15B, sectional structures of the memory cell portion and the logic portion of the DRAM chip having the above described DRAM mixed logic memory will be described. In the drawings, though the structure is shown only up to a level of a first metal interconnection 26 (described below) for the simplicity, generally about two to six layers of metal interconnections are employed besides first metal interconnection 26.

The memory cell portion shown in FIG. 15A includes, a bit line 21 formed of polycrystalline silicon, a polycide or the like, a storage node 22 formed of polycrystalline silicon or the like, a capacitor dielectric film 23 formed of a silicon oxide film, a silicon nitrided oxide film or the like, and a cell plate 24 formed of polycrystalline silicon or the like. In addition, the structure includes interlayer insulation films 28a, 29 and 30.

In the logic portion shown in FIG. 15B, an N type MIS transistor region 25n of a second MIS transistor and a P type MIS transistor region 25p of a third MIS transistor are arranged. Further, in P type MIS transistor region 25p, a third polycrystalline silicon film 5c of a P type polycrystalline silicon film doped with an impurity through ion implantation after the formation of the polycrystalline silicon film and a second silicide layer 6c of a silicide layer formed on third polycrystalline silicon film 5c are formed. Still further, in P type MIS transistor region 25p, a first metal interconnection 26, and metal plugs 27 connecting first metal interconnection 26 and the active region, and first metal interconnection 26 and the gate electrode (not shown) of the transistor are formed. In some cases, first metal interconnection 26 and metal plug 27 are employed also in the memory cell portion. An interlayer insulation film 28b is also provided.

Next, a method for manufacturing first and second MIS transistors in a memory cell portion and a logic portion of a DRAM mixed logic memory will be described. Here the manufacturing processes up to the formation of interlayer insulation film 28a shown in FIG. 15 will be described and the process after the formation of interlayer insulation film 28a will not be described. In addition, as a manufacturing process of a third MIS transistor, which is a P type MIS transistor, is the same with that of first and second MIS transistor, the description thereof will not be repeated.

With reference to FIG. 16, P type well region 2a and an N type well region 2c (see FIG. 15) are formed on semiconductor substrate 1a.

Then, trench isolation region 3a is formed in a region reaching a certain depth from a surface of P type well region 2a. After the memory cell portion is covered by a resist film 32, a silicon oxide film is formed as gate insulation film 4b of the logic portion in the thickness range of about 2 to 4 nm. Thereafter polycrystalline silicon film 5b not doped with an impurity and a silicon oxide film 31 are formed.

Then, anisotropic etching is performed on silicon oxide film 31 by the photolithography technique. Thereafter anisotropic etching is performed on polycrystalline silicon film 5b and gate insulation film 4b using silicon oxide film 31 as a mask, and the gate electrode pattern of the logic portion is formed.

Then implantation of an n type impurity is performed respectively on the N type MIS transistor and P type MIS transistor of the logic portion, forming n type extension region 7b and an n type extension region 7c (see FIG. 15).

As shown in FIG. 17, after the removal of silicon oxide film 31 on the gate electrode through the wet etching or the like, insulation film 4a of a silicon oxide film or the like is formed. In addition, sidewall 9b of the MIS transistor in the logic portion is formed through etchback technique. Here, through the wet etching or the like, silicon oxide film 31 on the gate electrode has been previously removed.

Then, through N+ implantation for forming source/drain of the N type MIS transistor in the logic portion, N+ source/drain active region 8a is formed and through P+ implantation for source/drain of the P type MIS transistor, a P+ source/drain active region 8b (see FIG. 15) is formed. Here an N type impurity similar to that in the active region is implanted into polycrystalline silicon layer 5b of the gate electrode of the N type MIS transistor in the logic portion. P type impurity is implanted to the P type MIS transistor in the same manner.

Then after the removal of resist film 32, gate insulation film 4a of the memory cell portion is formed. For example, a silicon oxide film of about 7 to 10 nm thickness is formed.

Next with reference to FIG. 18, first polycrystalline silicon film 5a of a doped polycrystalline silicon film, first silicide layer 6a of a tungsten silicide layer and insulation film 9a of a silicon nitrided oxide film are formed. Thereafter, a resist 33 is formed through the photolithography technique in a portion that is to be the gate electrode of the memory cell portion as shown in the figure.

With reference to FIG. 19, anisotropic etching is performed on insulating film 9a and first polycrystalline silicon film 5a using resist 33 as a mask, and a gate electrode pattern of the memory cell portion is formed. Then an N type impurity is implanted to the memory cell portion. FIG. 19 shows portions after the N– implantation for source/drain.

Next with reference to FIG. 20, insulation film 9c of a silicon nitrided oxide film or the like is formed and is removed in the portion other than the portion corresponding to the memory cell portion through the photolithography technique and etching technique.

Then through sputtering of cobalt (Co), a portion of source/drain region 7b and a portion of second polycrystalline silicon film 5b of the gate electrode in the logic portion are turned into a silicide. Thus, second silicide layer 6b and third silicide layer 10 are formed as shown in FIG. 20. By the following formation of first metal interconnection 26, metal plug 27 and interlayer insulation films 28a, 29, and 30, the DRAM mixed logic memory as shown in FIG. 15 is finished.

The DRAM mixed logic memory device as described above has the following four problems.

First, as the MIS transistor of the memory cell portion is formed after the formation of the MIS transistor in the logic portion, polycrystalline silicon produced at the formation of the gate electrode of the MIS transistor in the memory cell portion is left in the logic portion as a residue. This residual polycrystalline silicon causes an electrical short circuit or the like. As shown in FIG. 19, for example, a polycrystalline silicon residue 34a is left in the proximity of a lower portion of sidewall 9b of the MIS transistor in the logic portion.

Secondly, as the gate electrode structure is different in the memory cell portion and the logic portion, the gate electrode of the memory cell portion is formed after the formation of the source/drain active regions and the gate electrode of the logic portion. Therefore because of the previous formation of the MIS transistor in the logic portion, the effect of heat treatment and impurity diffusion is enhanced at the formation of the MIS transistor of the memory cell portion, and hence a substantial interval between the source/drain active regions become decreased. Therefore, compared with a structure in which each logic is formed separately, it is difficult to shorten the gate length of the logic portion.

Thirdly, as mentioned in the description of the second problem, as unintended extra heat is applied on the device compared with the case in which the DRAM or the logic is formed separately, the DRAM in which use of an ultra small transistor is required cannot be formed prior to the formation of the gate electrode of the logic portion.

Therefore during the etching process for the formation of the gate electrode of the MIS transistor in the logic portion, a surface of the semiconductor substrate in the memory cell portion is affected, for example being damaged by the etching. Thus, a leakage current generated in a storage node region of each memory cell is increased. In view of the structure of the memory cell of the DRAM, the suppression of the leakage current is prerequisite and the condition of leakage current suppression is more stringent in the logic portion.

Fourthly, because of the above described first to third problems, the above described MIS transistor cannot be employed in the DRAM mixed logic memory device in practice. As a result, gate insulation films with different thickness are employed in the memory cell portion and the logic portion, and doped polycrystalline silicon and tungsten silicide are employed for the gate electrode of the logic portion as the common material with the memory cell portion.

Therefore compared with the chip in which a logic is formed separately, sheet resistance of the gate electrode interconnection and the active region in the logic portion are high. In addition, as the P type MIS transistor includes a gate electrode of N type polycrystalline silicon with lower performance than a gate electrode of P type polycrystalline silicon, in other words, as the P type MIS transistor is of a buried channel type with lower performance than a surface channel type, the operation speed of the transistor is not satisfactory.

SUMMARY OF THE INVENTION

An object of the present invention is to eliminate polycrystalline silicon residue and to prevent a short circuit.

Another object of the present invention is to realize a ultra small MIS transistor employing an MIS transistor with a short gate length in the logic portion by suppressing the impurity diffusion.

Still another object of the present invention is to suppress the damage on the semiconductor substrate caused by the etching at the formation of the MIS transistor in the logic portion in the memory cell portion.

A still further object of the present invention is to realize a high performance MIS transistor in the logic portion.

In one aspect of the present invention, a semiconductor device includes: a memory cell portion and a logic portion formed on a semiconductor substrate; a first MIS transistor formed in the memory cell portion; a second MIS transistor of a first conductivity type and a third MIS transistor of a second conductivity type formed in the logic portion; a gate electrode of the first MIS transistor having a first polycrystalline silicon film and a first silicide layer; a gate electrode of the second MIS transistor having a second polycrystalline silicon film of the first conductivity type and a second silicide layer of the first conductivity type; and a gate electrode of the third MIS transistor having a third polycrystalline silicon film of the second conductivity type and a second silicide layer of the second conductivity type. In addition, a gate insulation film of the first MIS transistor is thicker than a gate insulation film of the second MIS transistor and a gate insulation film of the third MIS transistor, and source/drain active regions of the second MIS transistor and source/drain active regions of the third MIS transistor each have a third silicide layer, and values of sheet resistance of the second silicide layer and the third silicide layer are set lower than sheet resistance of the first silicide layer.

In addition, preferably in the present invention, the gate insulation film of the first MIS transistor is thicker at a peripheral portion of the gate electrode than at a central portion of the gate electrode.

In addition, preferably in the present invention, a silicon oxide film and a silicon nitrided oxide film, or, a silicon oxide film and silicon nitride film are formed on the first silicide layer of the gate electrode of the first MIS transistor.

In addition, preferably in the present invention, the gate insulation film of the third MIS transistor is a silicon nitrided oxide film.

In one aspect of the present invention, the method of manufacturing the semiconductor device includes the steps of: forming the gate insulation film of the second MIS transistor, the gate insulation film of the third MIS transistor, the second polycrystalline silicon film and the third polycrystalline silicon film, and forming patterns of the gate insulation film of the second MIS transistor and the gate insulation film of the third MIS transistor; forming sidewalls of the second MIS transistor and the third MIS transistor; forming the gate insulation film of the first MIS transistor, the first polycrystalline silicon film and the first silicide film, and forming a pattern of the gate electrode of the first MIS transistor; oxidizing a polycrystalline silicon residue produced in forming the pattern of the gate electrode of the first MIS transistor and a surface of the semiconductor substrate; forming an insulation film covering the gate electrode of the first MIS transistor; and turning the gate electrode of the second MIS transistor, the gate electrode and the source/drain active regions of the third MIS transistor into a silicide.

In another aspect of the present invention, the method of manufacturing the semiconductor device includes the steps of: forming the gate insulation film of the first MIS transistor and the first polycrystalline silicon film and a first silicide film, and forming a pattern of the gate electrode of the first MIS transistor; forming an insulation film covering the gate electrode of the first MIS transistor; forming the gate insulation film of the second MIS transistor, the gate insulation film of the third MIS transistor, the second polycrystalline silicon film and the third polycrystalline silicon film, and forming patterns of the gate electrode of the second MIS transistor and the gate electrode of the third MIS transistor; oxidizing a polycrystalline silicon residue produced in forming the patterns of the gate electrode of the second MIS transistor and the gate electrode of the third MIS transistor and a surface of the semiconductor substrate; forming sidewalls of the second MIS transistor and the third MIS transistor; and turning the gate electrode and the source/drain active regions of the second MIS transistor, and the gate electrode and the source/drain active regions of the third MIS transistor into a silicide.

In addition, preferably in the present invention, the step of oxidizing the polycrystalline silicon residue and the surface of the semiconductor substrate includes a step of performing lamp anneal.

In addition, preferably in the present invention, the lamp anneal is performed at a temperature of at least 1000° C.

Thus, according to the present invention, a reliable MIS transistor can be obtained by the deformation of the shape of the gate electrode portion through oxidation.

In addition, a high performance MIS transistor can be obtained by the use of P type polycrystalline silicon for the gate electrode of the P type MIS transistor.

Still in addition, according to the present invention, as the silicon oxide film is sandwiched, no problem will be caused in the adhesion between the silicon nitrided oxide film or silicon nitride film and the silicide layer forming the gate electrode.

Still additionally, according to the present invention, diffusion of boron is suppressed because the silicon nitrided oxide film forms the gate insulation film of the P type MIS transistor in the logic portion.

Still additionally, according to the present invention, the polycrystalline silicon residue is eliminated by the oxidation process and the problem of the short circuit is eliminated.

According to the present invention, as the gate electrode is formed in the logic portion after the formation of the gate electrode in the memory cell portion, a leakage current produced in the memory cell portion is suppressed.

Still further, according to the present invention, impurity diffusion is suppressed by lamp anneal. Further, the impurity diffusion is suppressed by the heat treatment at a high temperature.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a second sectional view of a first MIS transistor in a memory cell portion of a DRAM mixed logic memory according to a first embodiment of the present invention and FIG. 2B is a second sectional view of a second MIS transistor in a logic portion of the DRAM mixed logic memory according to the first embodiment of the present invention.

FIGS. 9 to 12 are sectional views referenced for describing first to fourth manufacturing steps, respectively, of a DRAM mixed logic memory according to a second embodiment of the present invention.

FIG. 14A is a first sectional view of a first MIS transistor in a memory cell portion of a DRAM mixed logic memory according to the prior art and FIG. 14B is a first sectional view of a second MIS transistor in a logic portion of the DRAM mixed logic memory according to the prior art.

DESCRIPTION OF THE PREFERRED EMBODIMENTS

First Embodiment

Figure 1A:
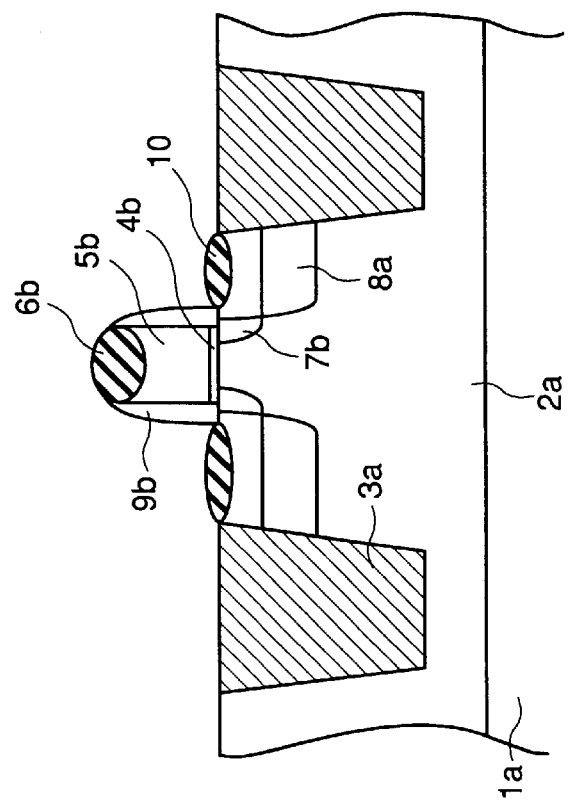
FIG. 1A is a first sectional view of a first MIS transistor in a memory cell portion of a DRAM mixed logic memory according to a first embodiment of the present invention.
Figure 1B:
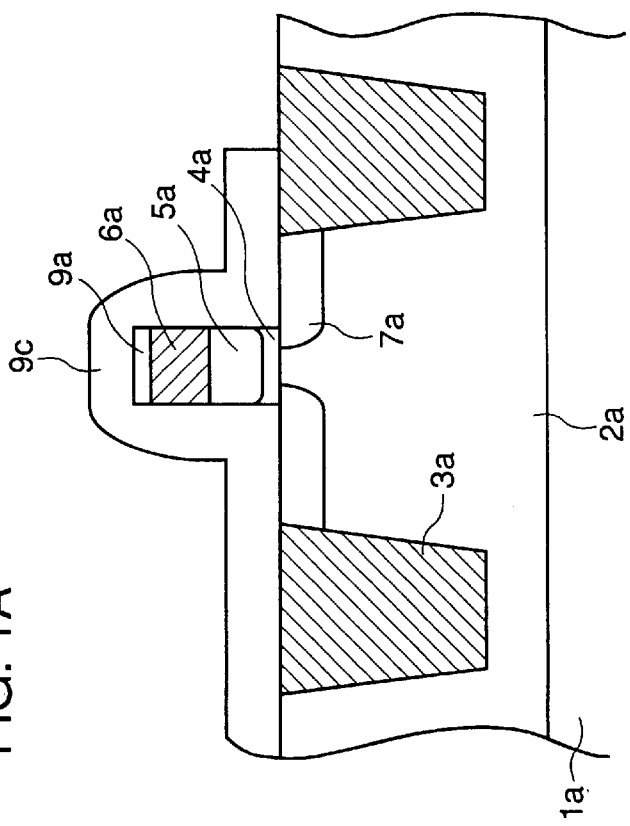
FIG. 1B is a first sectional view of a second MIS transistor in a logic portion of the DRAM mixed logic memory according to the first embodiment of the present invention.

With reference to FIGS. 1A and 1B, sectional structures of a first MIS transistor in a memory cell portion and a second MIS transistor in a logic portion of a DRAM mixed logic memory according to a first embodiment of the present invention will be described. Here, both transistors are N type MIS transistors.

A semiconductor device shown in FIG. 1 includes a semiconductor substrate 1a, a P type well region 2a, a trench isolation region 3a, gate insulation films 4a and 4b of silicon oxide films or the like, a first polycrystalline silicon film 5a of a polycrystalline silicon film doped with an N type impurity or the like, a second polycrystalline silicon film 5b of an N type polycrystalline silicon film doped with an impurity by ion implantation after the formation of the polycrystalline silicon film, a first silicide layer 6a of a tungsten silicide (WxSiy) layer or the like, a second silicide layer 6b of a titanium silicide (TixSiy) layer, a cobalt silicide (CoxSiy) layer or the like, N- source/drain active regions 7a, an extension region 7b, N+ source/drain active regions 8a, insulation films 9a and 9c of a silicon nitride film, a silicon nitrided oxide insulation film, or the like, an insulation film 9b of a silicon nitrided oxide film, a silicon oxide film (both will be referred to as silicon oxide film hereinafter) or the like, and a third silicide layer 10 of a titanium silicide (TixSiy) layer, a cobalt silicide (CoxSiy) layer or the like formed as a silicide layer on the active region.

First polycrystalline silicon film 5a and first silicide layer 6a form a gate electrode of the first MIS transistor of the memory cell portion. Second polycrystalline silicon film 5b and second silicide layer 6b form a gate electrode of the second MIS transistor of the logic portion.

Insulation film 9c covers the gate electrode of the first MIS transistor of the memory cell portion and insulation film 9b is a sidewall.

With reference to FIGS. 2A and 2B, sectional structures of the memory cell portion and the logic portion of the DRAM chip having the above described DRAM mixed logic memory will be described. In the drawings, though the structure is shown only up to a level of a first metal interconnection 26 (described below) for the simplicity, generally about two to six layers of metal interconnections are employed besides first metal interconnection 26.

The memory cell portion shown in FIG. 2A includes, a bit line 21 formed of polycrystalline silicon, a polycide or the like, a storage node 22 formed of polycrystalline silicon or the like, a capacitor dielectric film 23 formed of a silicon oxide film, silicon nitrided oxide film or the like, and a cell plate 24 formed of polycrystalline silicon or the like.

In the logic portion shown in FIG. 2B, an N type MIS transistor region 25n of a second MIS transistor and a P type MIS transistor region 25p of a third MIS transistor are arranged. Further, in P type MIS transistor region 25p, a third polycrystalline silicon film 5c of a P type polycrystalline silicon film doped with an impurity through ion implantation after the formation of the polycrystalline silicon film and a second silicide layer 6c of a silicide layer formed on third polycrystalline silicon film 5c are formed. Still further, in P type MIS transistor region 25p, a first metal interconnection 26, and metal plugs 27 connecting first metal interconnection 26 and the active region, and first metal interconnection 26 and the gate electrode (not shown) of the transistor are formed. In some cases, first metal interconnection 26 and metal plug 27 are employed also in the memory cell portion. Interlayer insulation films 28a, 29 and 30 shared by the memory cell portion and the logic portion are also provided.

Next, a method of manufacturing first and second MIS transistors in the memory cell portion and the logic portion of the DRAM mixed logic memory according to an embodiment of the present invention will be described. Here, the manufacturing processes up to the formation of interlayer insulation film 28a shown in FIG. 2 will be described and the process after the formation of interlayer insulation film 28a will not be described. In addition, as a manufacturing process of a third MIS transistor, which is a P type MIS transistor, is the same with that of first and second MIS transistors, the description thereof will not be repeated.

Figure 3:
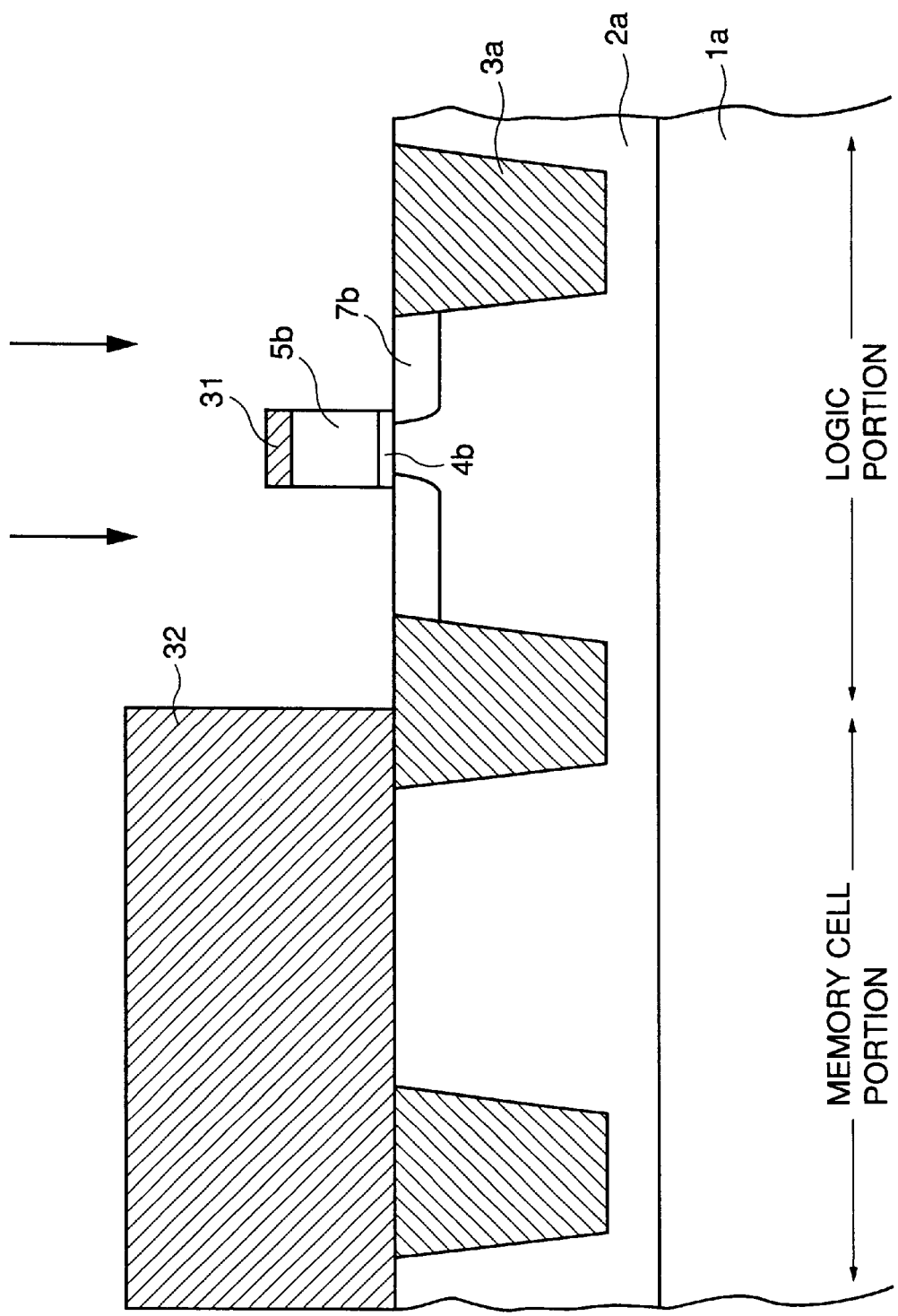
FIGS. 3 to 7 are sectional views referenced for describing first to fifth manufacturing steps, respectively, of a DRAM mixed logic memory according to a first embodiment of the present invention.

With reference to FIG. 3, P type well region 2a and N type well region 2c (see FIG. 2) are formed on semiconductor substrate 1a.

Then, trench isolation region 3a is formed in a region reaching a certain depth from a surface of P type well region 2a. After the memory cell portion is covered by a resist film 32, a silicon oxide film is formed as gate insulation film 4b of the logic portion in the range of about 2 to 4 nm thick. Thereafter polycrystalline silicon film 5b not doped with an impurity and a silicon oxide film 31 are formed.

Then, anisotropic etching is performed on silicon oxide film 31 by the photolithography technique. Thereafter anisotropic etching is performed on polycrystalline silicon film 5b and gate insulation film 4b using silicon oxide film 31 as a mask and the gate electrode pattern of the logic portion is formed.

Then implantation of n type impurity is performed respectively on the N type MIS transistor and P type MIS transistor of the logic portion, forming n type extension region 7b and an n type extension region 7c (see FIG. 2).

Figure 4:
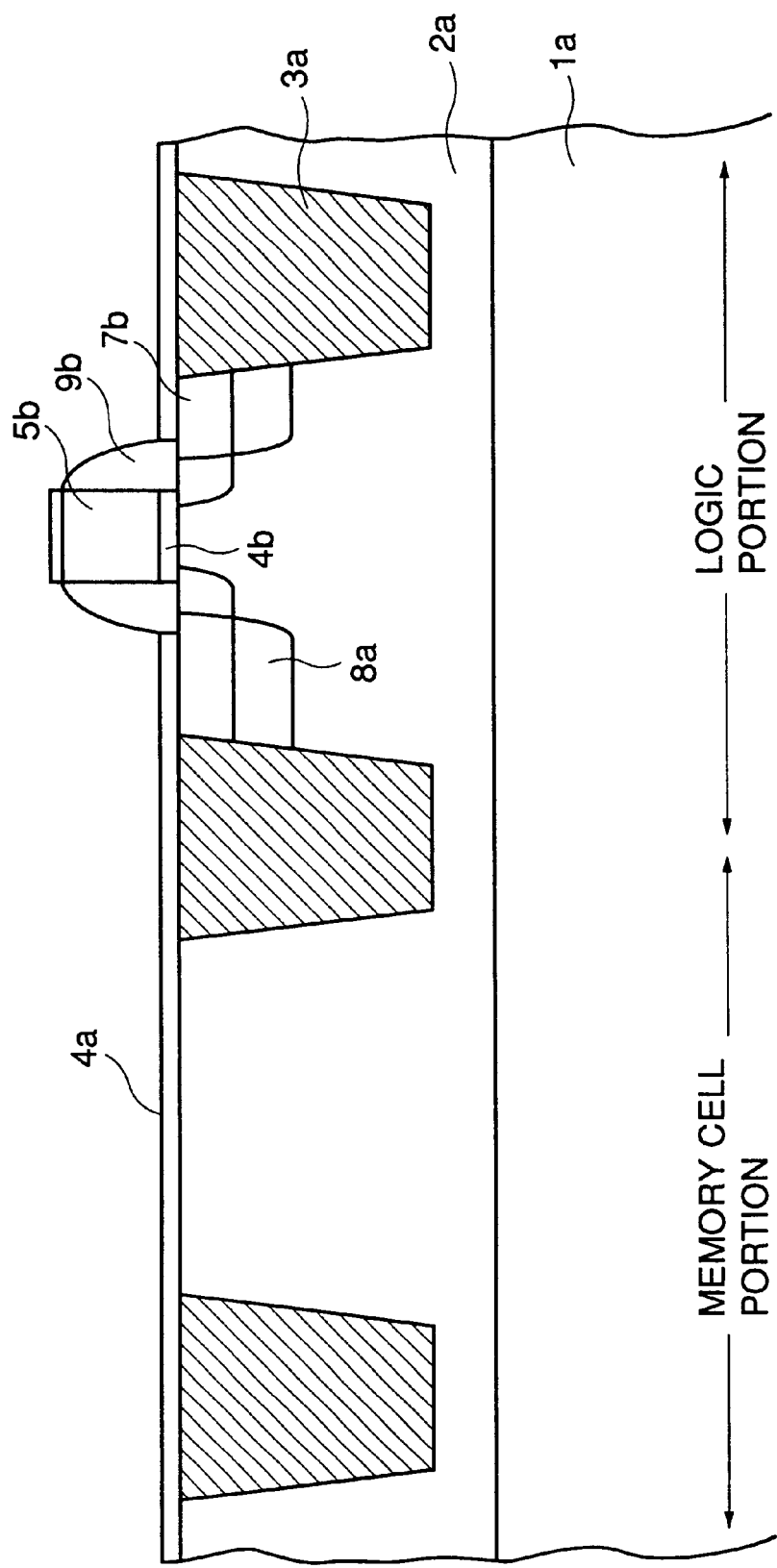

As shown in FIG. 4, after the removal of silicon oxide film 31 on the gate electrode through the wet etching or the like, insulation film 4a of a silicon oxide film or the like is formed. In addition, sidewall 9b of the MIS transistor in the logic portion is formed through etchback technique.

Then, through N+ impurity implantation for forming source/drain of the N type MIS transistor in the logic portion, N+ source/drain active region 8a is formed and through P+ impurity implantation for forming source/drain of the P type MIS transistor, P+ source/drain active region 8b (see FIG. 2) is formed. Here an N type impurity similar to that in the active region is implanted into polycrystalline silicon layer 5b of the gate electrode of the N type MIS transistor in the logic portion. A P type impurity is implanted to the P type MIS transistor in the same manner.

Then after the removal of resist film 32, gate insulation film 4a of the memory cell portion is formed. For example, a silicon oxide film of about 7 to 10 nm thickness is formed.

Figure 5:
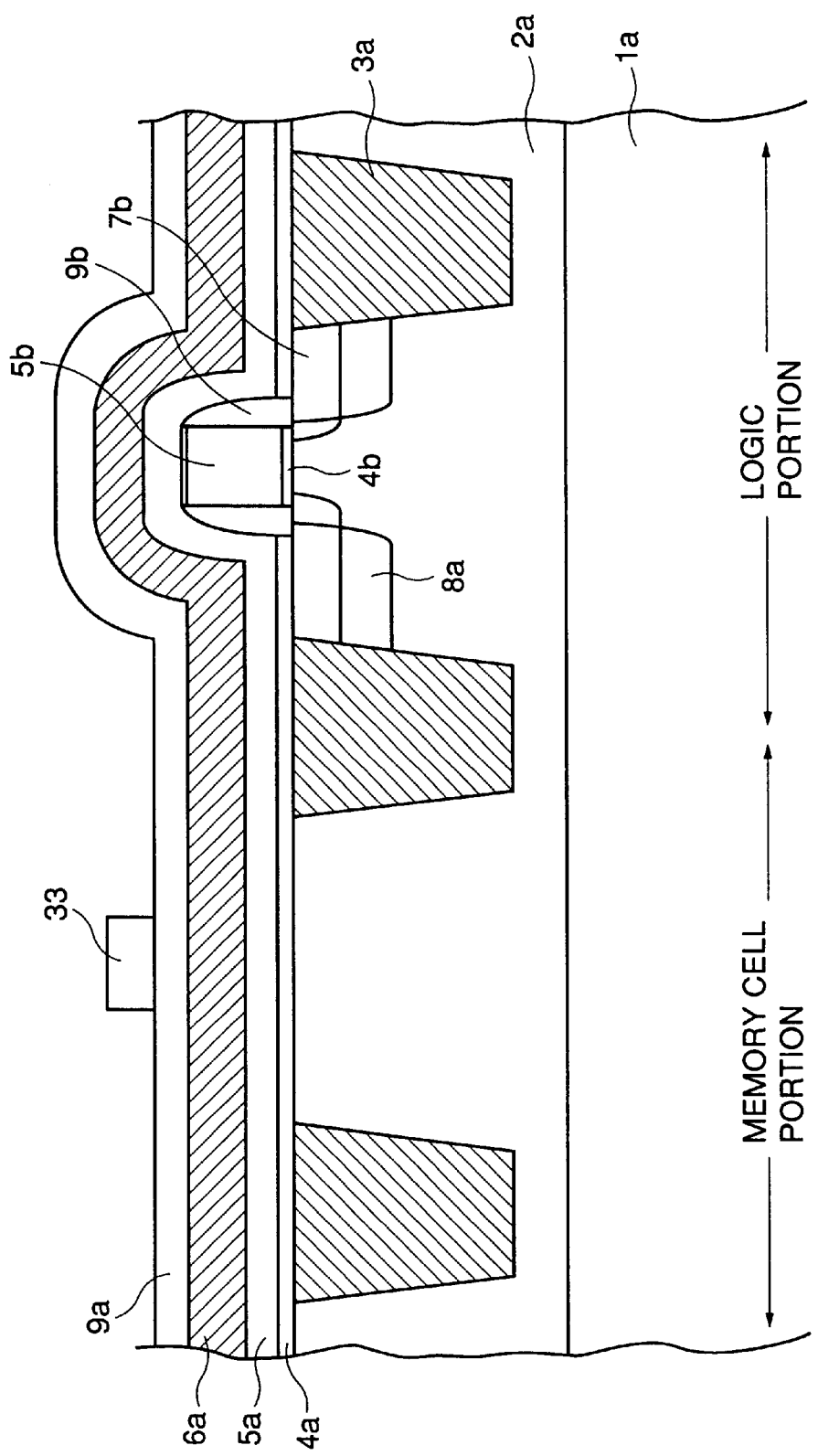

Next with reference to FIG. 5, first polycrystalline silicon film 5a of a doped polycrystalline silicon film, first silicide layer 6a of a tungsten silicide layer and insulation film 9a of a silicon nitrided oxide film are formed. Thereafter, a resist 33 is formed through the photolithography technique in a portion that is to be the gate electrode of the memory cell portion as shown in FIG. 5.

Figure 6:
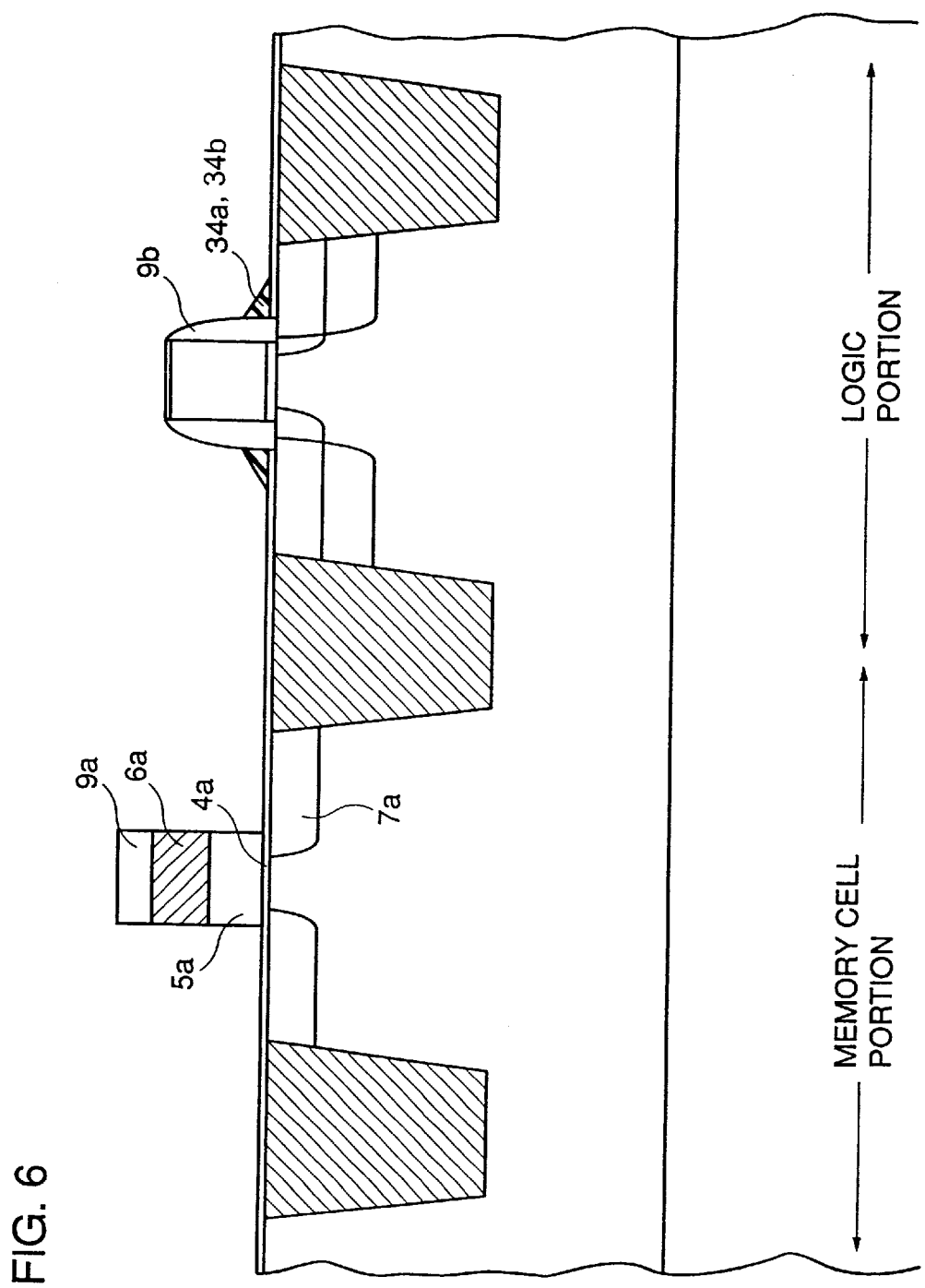

With reference to FIG. 6, anisotropic etching is performed on insulating film 9a and first polycrystalline silicon film 5a using resist 33 as a mask and a gate electrode pattern of the memory cell portion is formed. Here, as shown in FIG. 6, a polycrystalline silicon residue 34a which is a residue of first polycrystalline silicon film 5a employed for forming the gate electrode of the memory cell portion is left in the logic portion. To eliminate the residue, semiconductor substrate 1a and polycrystalline silicon residue 34a are oxidized and turned into silicon oxide film 34b.

Then in the memory cell portion, an N type impurity is implanted and N type source/drain active regions 7a are formed.

Figure 7:
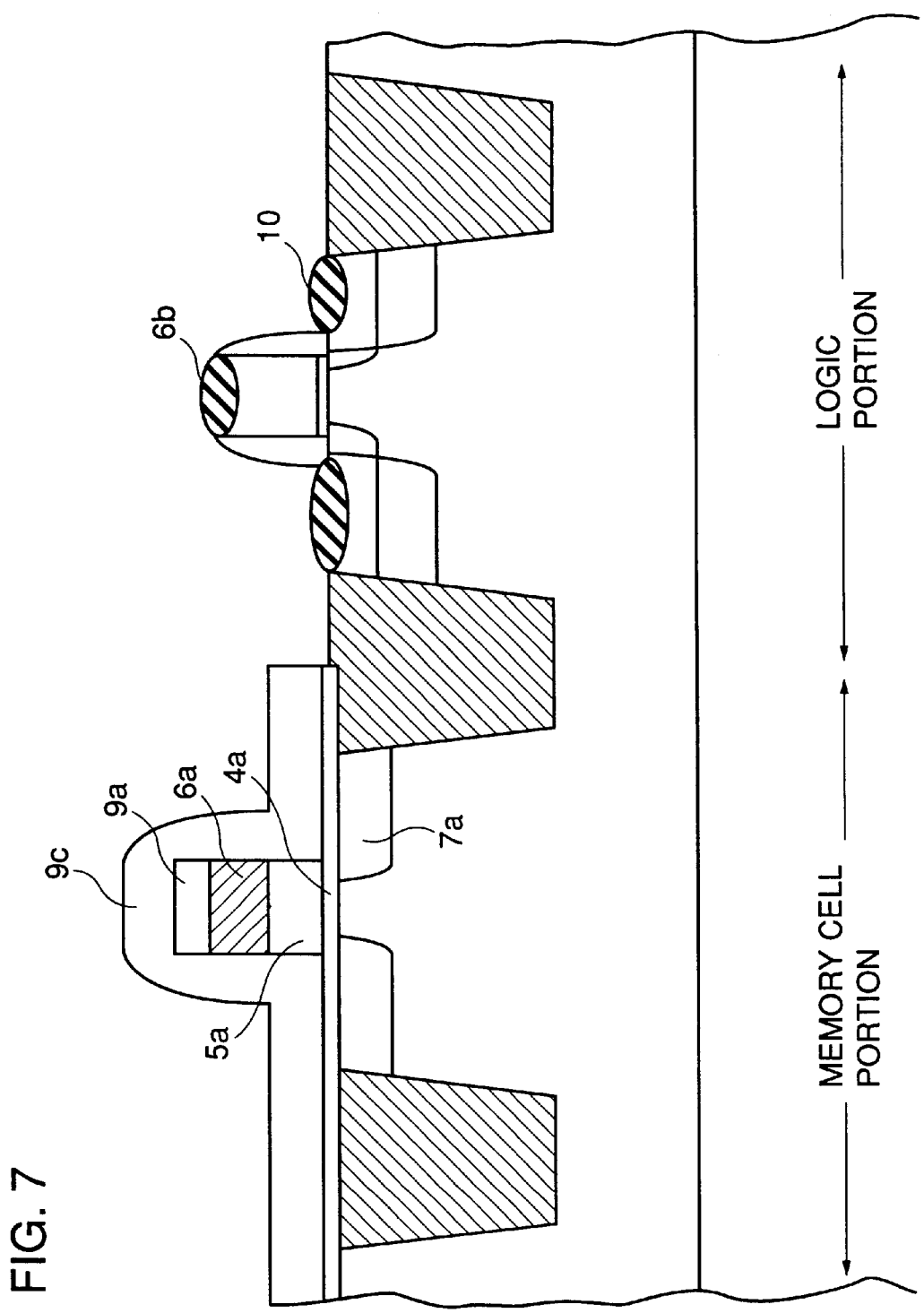

Next with reference to FIG. 7, insulation film 9c of a silicon nitrided oxide film or the like is formed and is removed in the portion other than the portion corresponding to the memory cell portion through the photolithography technique and etching technique.

Then through sputtering of cobalt (Co), a portion of source/drain region 7b and a portion of second polycrystalline silicon film 5b of the gate electrode in the logic portion are turned into a silicide. Thus, second silicide layer 6b and third silicide layer 10 are formed as shown in FIG. 7. By the following formation of first metal interconnection 26, metal plug 27 and interlayer insulation films 28a, 29, and 30, the DRAM mixed logic memory as shown in FIG. 1 is finished.

The difference between the manufacturing method according to the prior art and the manufacturing method according to the embodiments of the present invention lies in the process after the formation of the gate electrode pattern in the memory cell portion.

As described with reference to FIG. 6, through the oxidation process after the formation of gate electrode pattern in the memory cell portion, the semiconductor substrate and polycrystalline silicon residue 34a are oxidized and turned into silicon oxide film 34b. As a result, polycrystalline silicon residue 34a is eliminated and the first problem in the conventional art relating to short circuits caused by the polycrystalline silicon residue can be solved.

In addition, semiconductor substrate 1a and polycrystalline silicon in a peripheral portion of the gate electrode of the memory cell portion are oxidized. Hence as in gate insulation film 4a shown in the view of the sectional structure of the gate electrode in the memory cell portion of FIG. 1, gate insulation film 4a is thin in the central portion of the gate electrode and thick in the peripheral portion.

Therefore, due to the oxidation of semiconductor substrate 1a and the shape of the gate insulation film and so on, resistance of the MIS transistor to hot carrier is improved and a reliable MIS transistor is obtained.

Further, as P type polycrystalline silicon is employed for the gate electrode of the P type MIS transistor in the logic portion, the resulting MIS transistor is of a surface channel type and of a high performance and the fourth problem in conventional art, that is the problem in operation speed can be solved.

Second Embodiment

In a DRAM mixed logic memory according to the second embodiment, lamp anneal is performed in the oxidation of semiconductor substrate 1a and polycrystalline silicon residue 34a in the first embodiment. In the oxidation process according to the first embodiment described above, semiconductor substrate 1a is processed in a furnace. For polycrystalline silicon residue 34a that can be oxidized in a short time period, however, the oxidation in the furnace is not appropriate because only in putting semiconductor substrate 1a in and out of the furnace takes a several minutes.

Thus, preferably, heat treatment is performed on semiconductor substrate 1a and polycrystalline silicon residue 34a for about 30 to 60 seconds by lamp anneal which allows the oxidation in a short time period. Lamp anneal is preferable also because excessive oxidation of first polycrystalline silicon film 5a of doped polycrystalline silicon constituting the gate electrode can lead to an abnormality in the shape of the gate electrode.

Here, the temperature of lamp anneal is set at least 1000° C. to suppress the impurity diffusion in the following heat treatment, due to the following reason.

It has been reported in recent years that in a first heat treatment after high concentration ion implantation, diffusion is multiplied due to crystal defect. Generally the increase in impurity diffusion caused by the crystal defect is called TED (Transient Enhanced Diffusion). To suppress the TED, heat treatment is performed at high temperature in a short time period to rapidly eliminate the effect of the crystal defect. If the heat treatment is performed at low temperature, the effect of crystal defect cannot be eliminated sufficiently and impurity diffusion easily occurs in the following heat treatment. This is why the impurity is diffused to a large extent in the conventional manufacturing method.

In the embodiment of the present invention, as lamp anneal is performed at high temperature after the implantation of N+ and P+ source/drain, that is the high concentration ion implantation, the diffusion of the impurity is suppressed.

Thus, the second problem, which is the limitation in gate length due to impurity diffusion, can be solved by the suppression of diffusion through the lamp anneal with short time period heat treatment. In addition, as the effect of crystal defect can be eliminated by the heat treatment at high temperature, diffusion of the impurity can be further suppressed.

Still further, with regard to the third problem, that is the damage caused by the etching, as the effect of crystal defect is eliminated by the high temperature lamp anneal, leakage current can be suppressed.

Here, when the P type polycrystalline silicon is employed for the gate electrode, boron in the P type polycrystalline silicon may penetrate an oxide film that is the gate insulation film and is diffused in a surface of semiconductor substrate 1a, affecting the threshold voltage or the like. Especially when high temperature lamp anneal is employed, diffusion may easily occur. Therefore gate insulation film 4b in the logic portion is preferably formed of the silicon nitrided oxide film having an effect of suppressing the diffusion of boron. In this case, to simplify the manufacturing method, gate insulation film 4a of the N type MIS transistor in the logic portion may be formed of a silicon nitrided oxide film.

In addition, in a polycrystalline silicon film including impurity implanted through the ion implantation, activation ratio of the impurity is generally not satisfactory. However, by using lamp anneal described above at high temperature, the activation ratio can be increased and sheet resistance of the polycrystalline silicon can be lowered. In addition, depletion of the gate can be suppressed. Here, the depletion is the phenomenon of performance degradation of the transistor, in which the amount of impurities acting as electric charges substantially decreases because of the low activation ratio, and the depletion layer extending on the side of semiconductor substrate becomes easily extendable to polycrystalline silicon on the side of the gate electrode, causing the substantial effect of making the gate insulation film thick.

In addition, high temperature lamp anneal tends to lower the sheet resistance of tungsten silicide layer on the gate electrode.

Third Embodiment

Figure 8A:
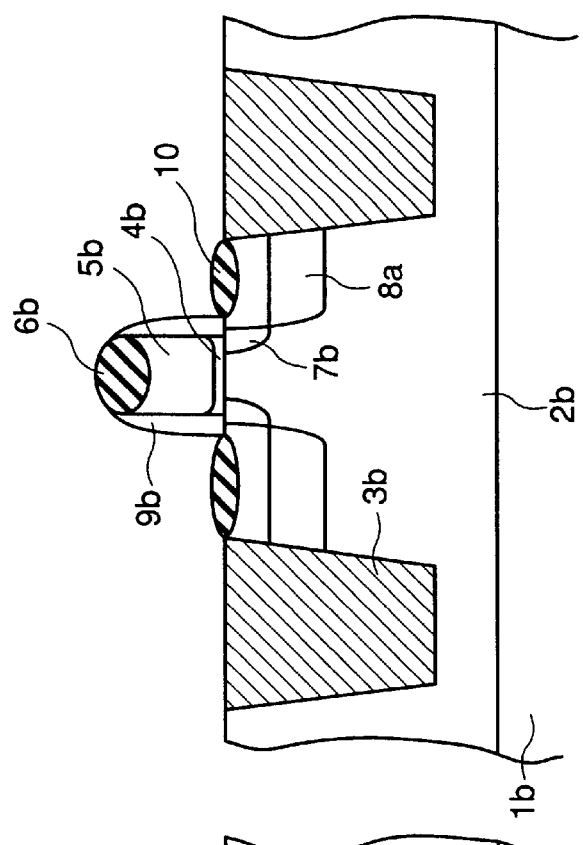
FIG. 8A is a sectional view of a first MIS transistor in a memory cell portion of a DRAM mixed logic memory according to a third embodiment of the present invention and FIG. 8B is a sectional view of a second MIS transistor in a logic portion of the DRAM mixed logic memory according to the third embodiment of the present invention.
Figure 8B:
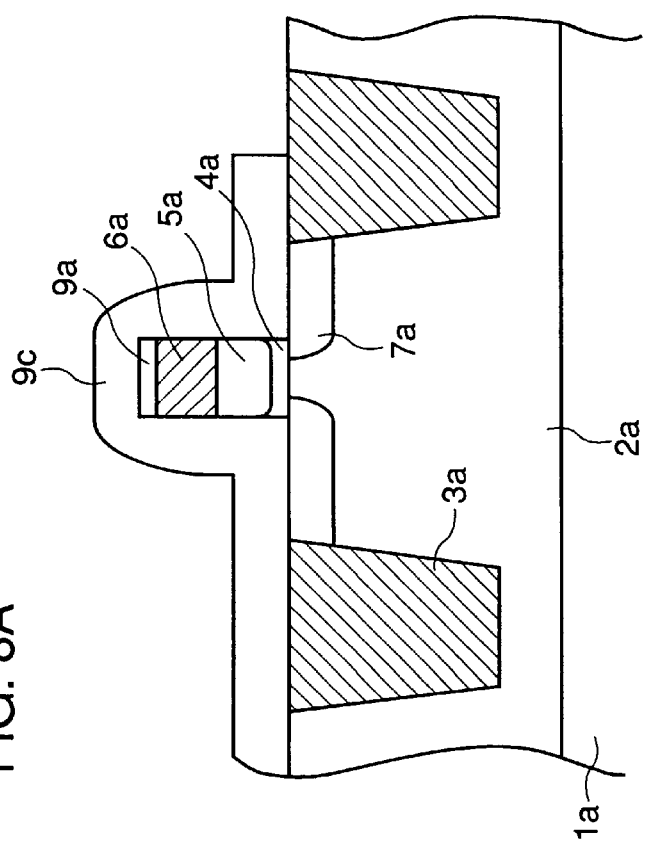

FIGS. 8A and 8B show sectional structures of N type MIS transistors of a DRAM mixed logic memory according to a third embodiment of the present invention.

Unlike the first embodiment, the gate insulation film is thin at the gate electrode central portion and thick in the peripheral portion not only in the memory cell portion as shown in FIG. 8A, but also in the logic portion as shown in FIG. 8B. Thus a reliable MIS transistor can be obtained also in the logic portion.

Next, the method for manufacturing the MIS transistors in the memory cell portion and the logic portion of the DRAM mixed logic memory according to the third embodiment of the present invention will be described. Here, the manufacturing process up to the formation of interlayer insulation film 28a as shown in FIG. 2 will be described and the manufacturing process after the formation of interlayer insulation film 28a will not be provided.

Figure 9:
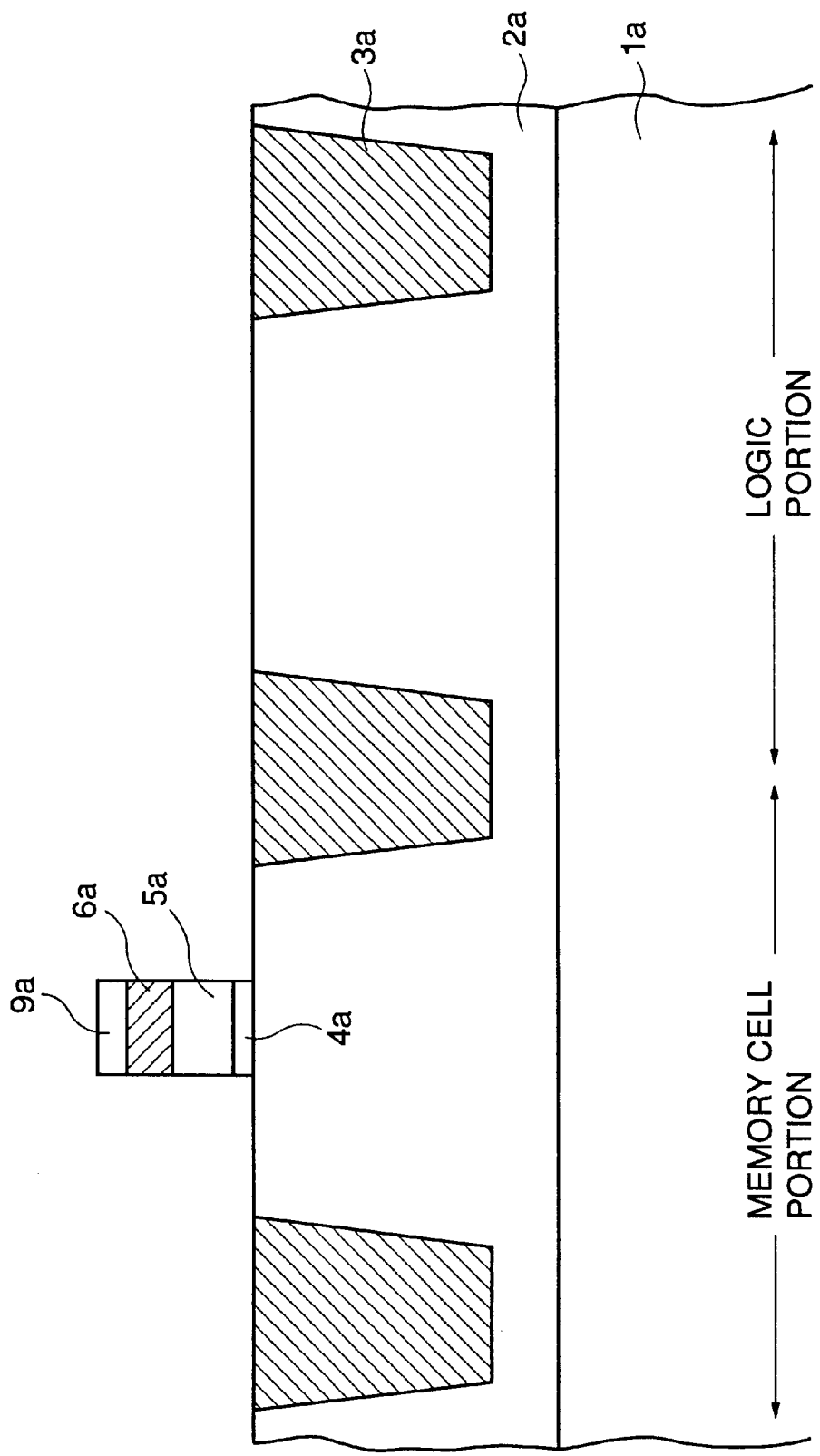

With reference to FIG. 9, first, P type well region 2a, N type well region 2c (not shown) and trench isolation region 3a are formed and then gate insulation film 4a is formed in the memory cell portion.

Thereafter, first polycrystalline silicon film 5a and first silicide layer 6a are formed and then insulation film 9a of a silicon nitrided oxide film or the like is formed. Then anisotropic etching is performed on the silicon nitrided oxide film through photolithography technique. Then anisotropic etching is performed on the first polycrystalline silicon film 5a and first silicide layer 6a using the silicon nitrided oxide film as a mask and the gate electrode pattern is formed in the memory cell portion. FIG. 9 shows each portion after the formation of the gate electrode pattern in the memory cell portion.

Next with reference to FIG. 10, semiconductor substrate 1a is oxidized. Then, impurity implantation is performed to form N type source/drain in the memory cell portion. Then insulation film 9c of a silicon nitrided oxide film or the like is formed and removed except in the memory cell portion through the photolithography technique and the etching technique. FIG. 10 shows each portion after the etching.

Next with reference to FIG. 11, a silicon oxide film is formed to about 2 to 4 nm thick as gate insulation film 4b in the logic portion, and then polycrystalline silicon layer 5b not doped with impurity and silicon oxide film 31 are formed. Then anisotropic etching is performed on silicon oxide film 31 through photolithography technique. And then the anisotropic etching is performed on polycrystalline silicon film 5b using silicon oxide film 31 as a mask and the gate electrode pattern is formed in the logic portion.

Here, as shown in FIG. 11, polycrystalline silicon residue 34a which is a residue of polycrystalline silicon film 5b employed for forming the gate electrode in the logic portion is left in the memory cell portion.

Next with reference to FIG. 12, semiconductor substrate 1a and polycrystalline silicon residue 34a are oxidized and turned into silicon oxide film 34b. Thereafter the implantation of impurity is performed for the N type MIS transistor and the P type MIS transistor in the logic portion, and extension regions 7a and 7b (not shown) are formed.

Then an insulation film of a silicon oxide film or the like is formed and etched back to form sidewall 9b on the MIS transistor in the logic portion. At this time, silicon oxide film 31 on the gate electrode has been previously removed through wet etching or the like.

Then N type impurity is implanted into the N type MIS transistor in the logic portion to form N type source/drain active regions 8a. P type impurity is implanted to the P type MIS transistor to form P+ type source/drain active regions 8b (not shown).

Then through sputtering of cobalt (Co), a portion of the source/drain active region and a portion of the polycrystalline silicon film of the gate electrode in the logic portion are turned into a silicide, and, second silicide layer 6b and third silicide layer 10 are formed as shown in FIG. 12. Thereafter with the formation of first metal interconnection 26, metal plug 27 and interlayer insulation films 28a, 29 and 30, the DRAM mixed logic memory as shown in FIG. 1 is finished.

The manufacturing method according to the third embodiment is different from the manufacturing method according to the first embodiment in that the gate electrode pattern of the memory cell portion is formed after the formation of the gate electrode pattern of the logic portion in the first embodiment whereas in the third embodiment the gate electrode pattern of the logic portion is formed after the gate electrode pattern of the memory cell portion.

Thus, as a surface of semiconductor substrate 1a in the memory cell portion is covered with insulation film 9c at the formation of the gate electrode of the logic portion as shown in FIG. 11, the etching for the gate electrode formation will not cause damage on semiconductor substrate 1a in the memory cell portion. Therefore the third problem described above, that is the increase in leakage current, will not be caused.

In addition, as the oxidation process is performed after the formation of the gate electrode in the logic portion, the first problem, that is the short circuit by the polycrystalline silicon residue, will not be caused.

Though a surface of the active region in the logic portion is roughened at the etching of insulation film 9c of a silicon nitride film or the like, with the oxidation process, roughness of the surface can be eliminated and silicide layer 10 can be formed at a constant thickness.

In addition, with the reversal of the formation sequence, extra heat is applied on memory cell portion, possibly affecting the miniaturization of the gate length. However, as the diffusion of impurity is suppressed by the RTA at a temperature equal to or higher than 1000° C. as in the second embodiment, no problem will be caused.

In addition, with the reversal of the formation sequence, insulation film 9c covering the gate electrode in the memory cell portion is shrinked by the oxidation at a high temperature. As a result, decrease in the thickness of the film at the following wet etching or the like is suppressed resulting in the fixed shape.

In addition, with the reversal of the formation sequence, in the first embodiment, polycrystalline silicon residue 34a left in the logic portion may be oxidized as shown in FIG. 6, narrowing the width of silicide layer 10 shown in FIG. 7 or degrading the uniformity of the quality of silicide layer 10. In the third embodiment, however, as polycrystalline silicon residue 34b is not left in the logic portion as shown in FIGS. 11 and 12, silicide layer 10 with a fixed width and uniform quality can be formed.

In addition, as the P type polycrystalline silicon is used for the gate electrode in the P type MIS transistor in the logic portion, resulting MIS transistor is of a surface channel type and with high performance. Thus the fourth problem in the conventional art, that is the problem in operation speed, can be solved.

In addition, when RTA is performed at a high temperature, diffusion of boron from P type polycrystalline silicon film 5c of the gate electrode can be suppressed by employing a silicon nitrided oxide film for gate insulation film 4a of the logic portion. In addition, to simplify the manufacturing method, gate insulation film 4a of the N type MIS transistor in the logic portion can be formed of a silicon nitrided oxide film.

Though in the third embodiment, the oxidation process is performed immediately after the gate electrode formation in the memory cell portion, the oxidation process is not necessary if the problem in the reliability of the MIS transistor in the memory cell portion does not exist. In this case the thickness of the gate insulation film shown in FIG. 8 becomes fixed.

Fourth Embodiment

Figure 13A:
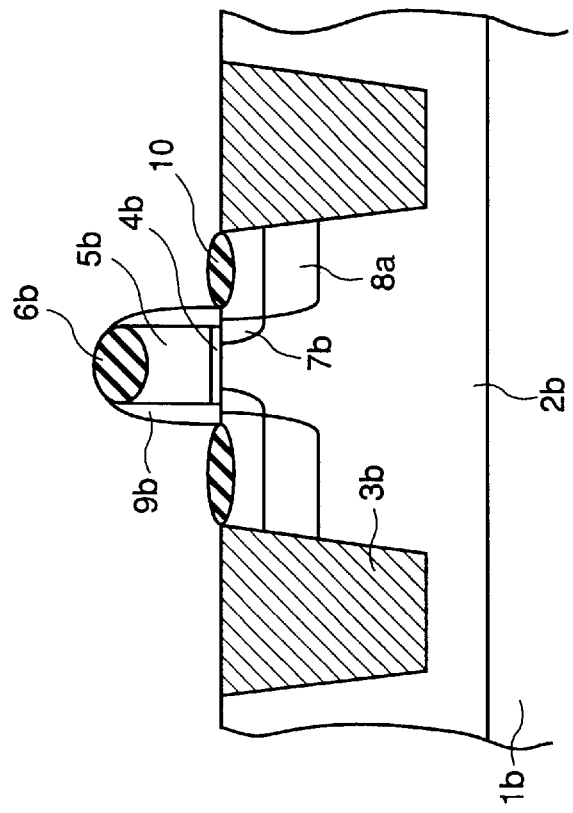
FIG. 13A is a sectional view of a first MIS transistor in a memory cell portion of a DRAM mixed logic memory according to a fourth embodiment of the present invention and FIG. 13B is a sectional view of a second MIS transistor in a logic portion of the DRAM mixed logic memory according to the fourth embodiment of the present invention.
Figure 13B:
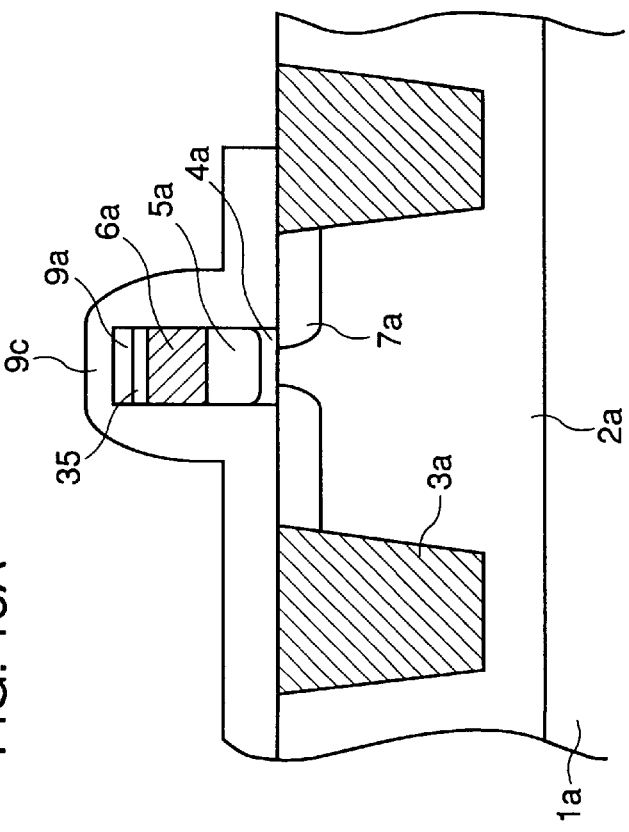
Figures 15A, 15B:
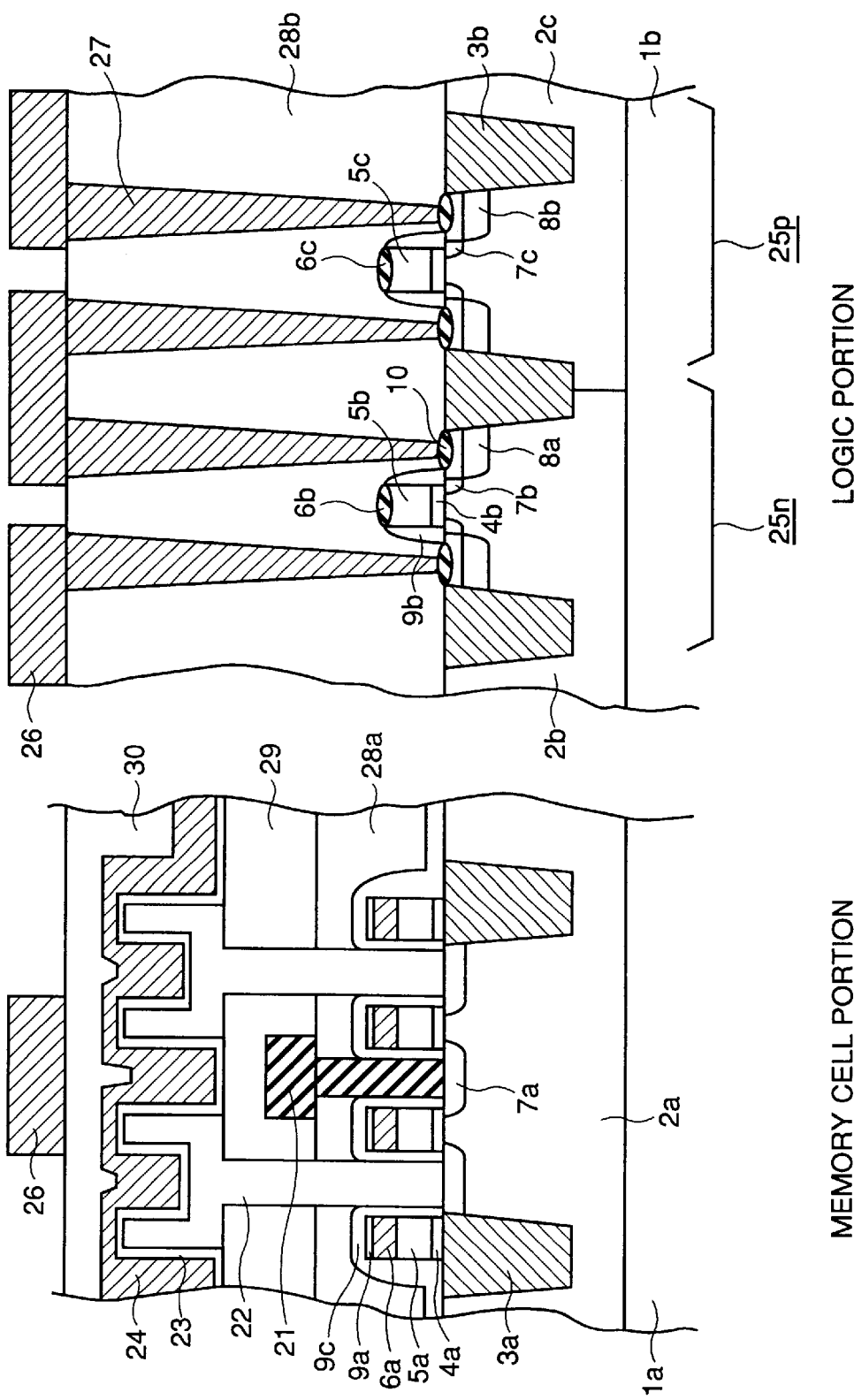
FIG. 15A is a second sectional view of a first MIS transistor in a memory cell portion of a DRAM mixed logic memory according to the prior art and FIG. 15B is a second sectional view of a second MIS transistor in a logic portion of the DRAM mixed logic memory according to the prior art.
Figure 16:
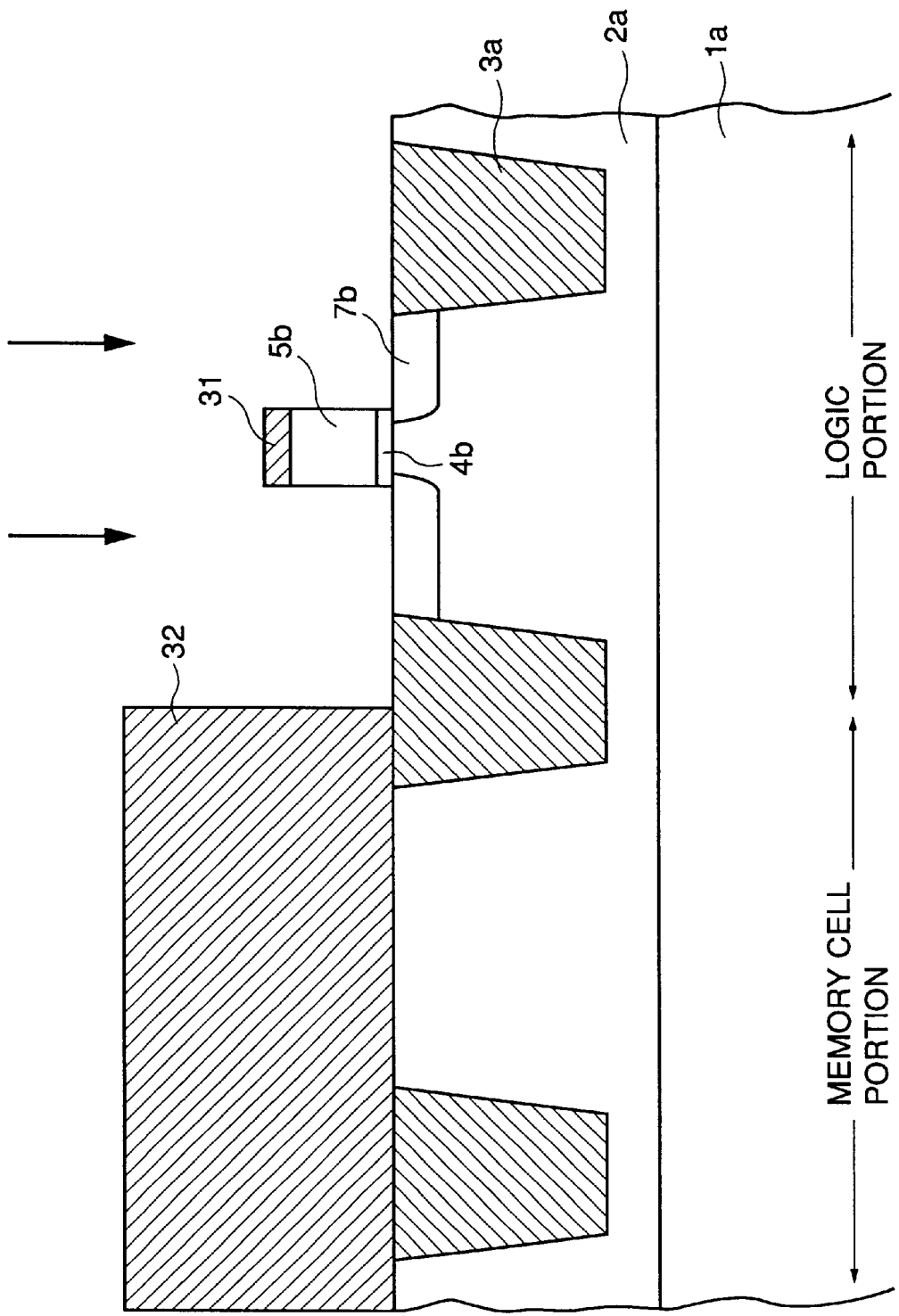
FIGS. 16 to 20 are sectional views referenced for describing first to fifth manufacturing steps, respectively, of a DRAM mixed logic memory according to the prior art.
Figure 17:
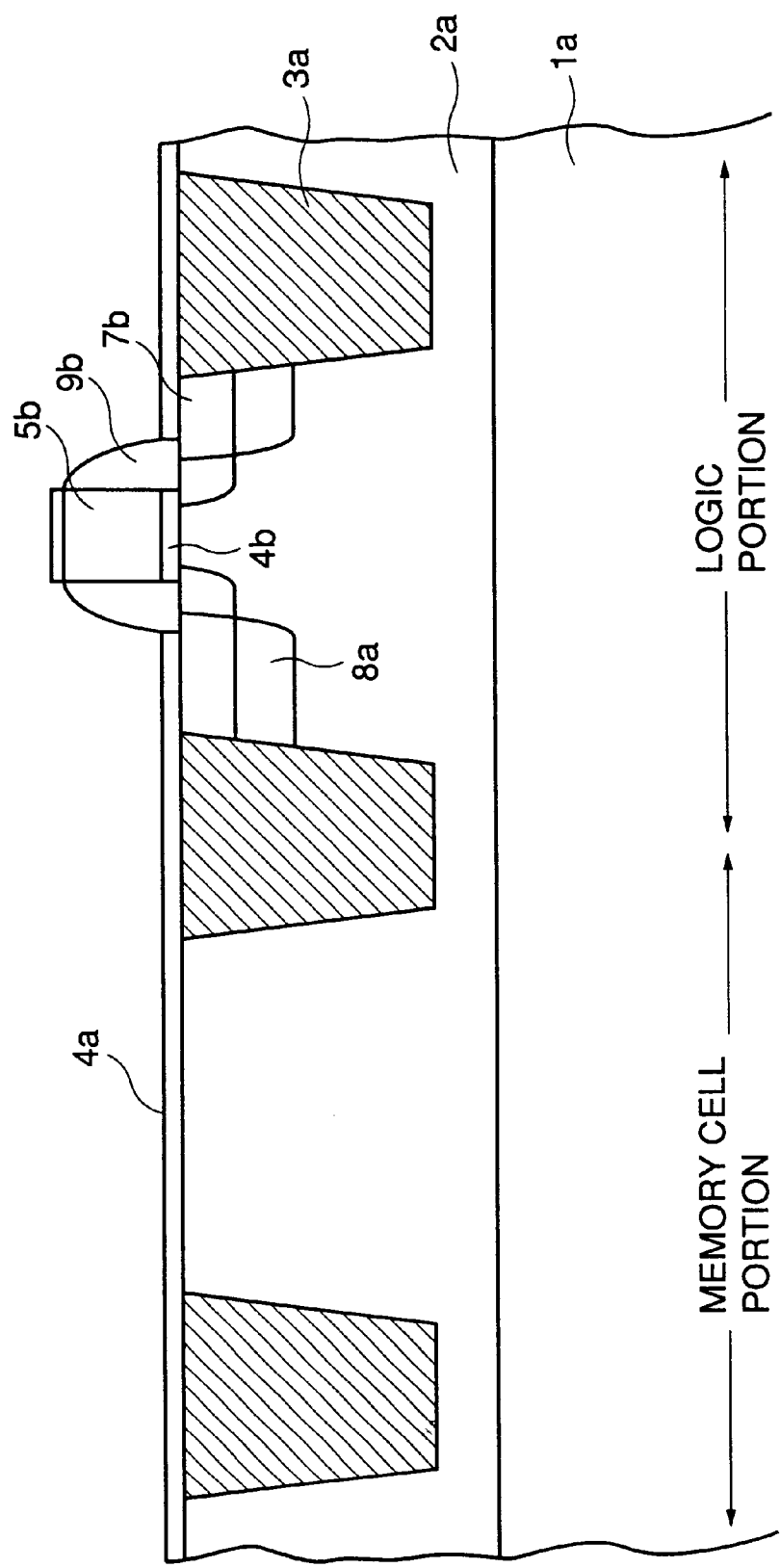
Figure 18:
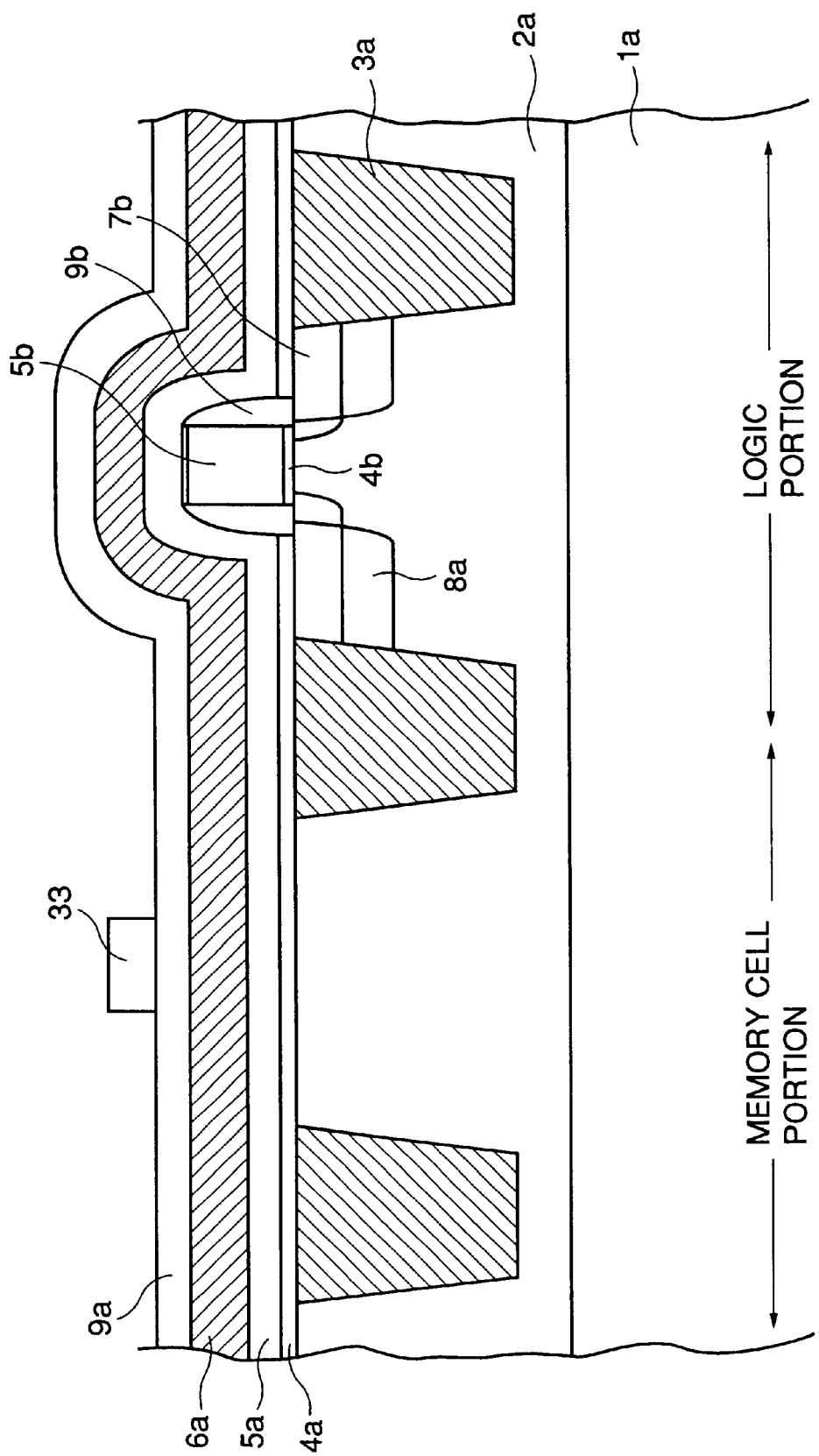
Figure 19:
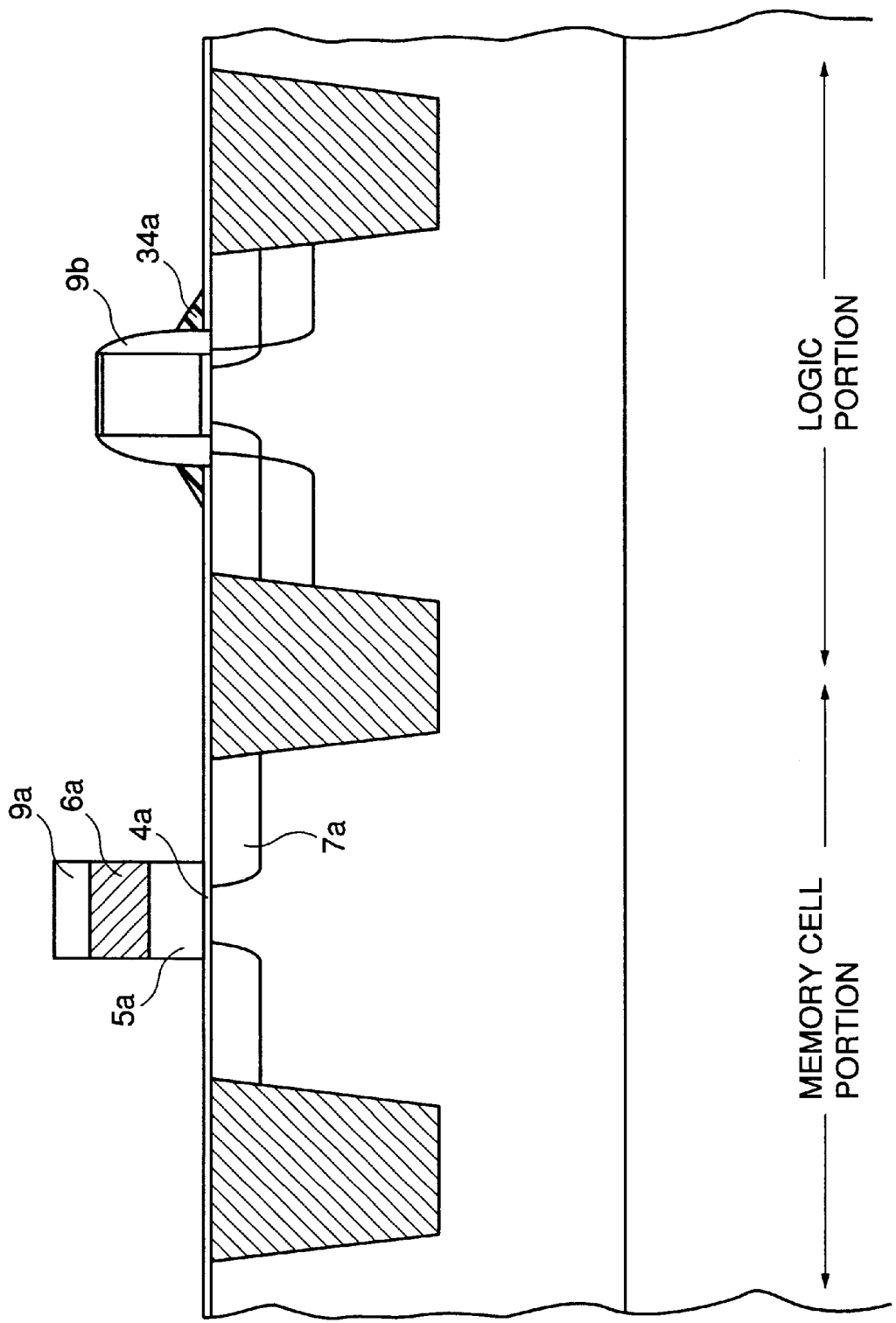
Figure 20:
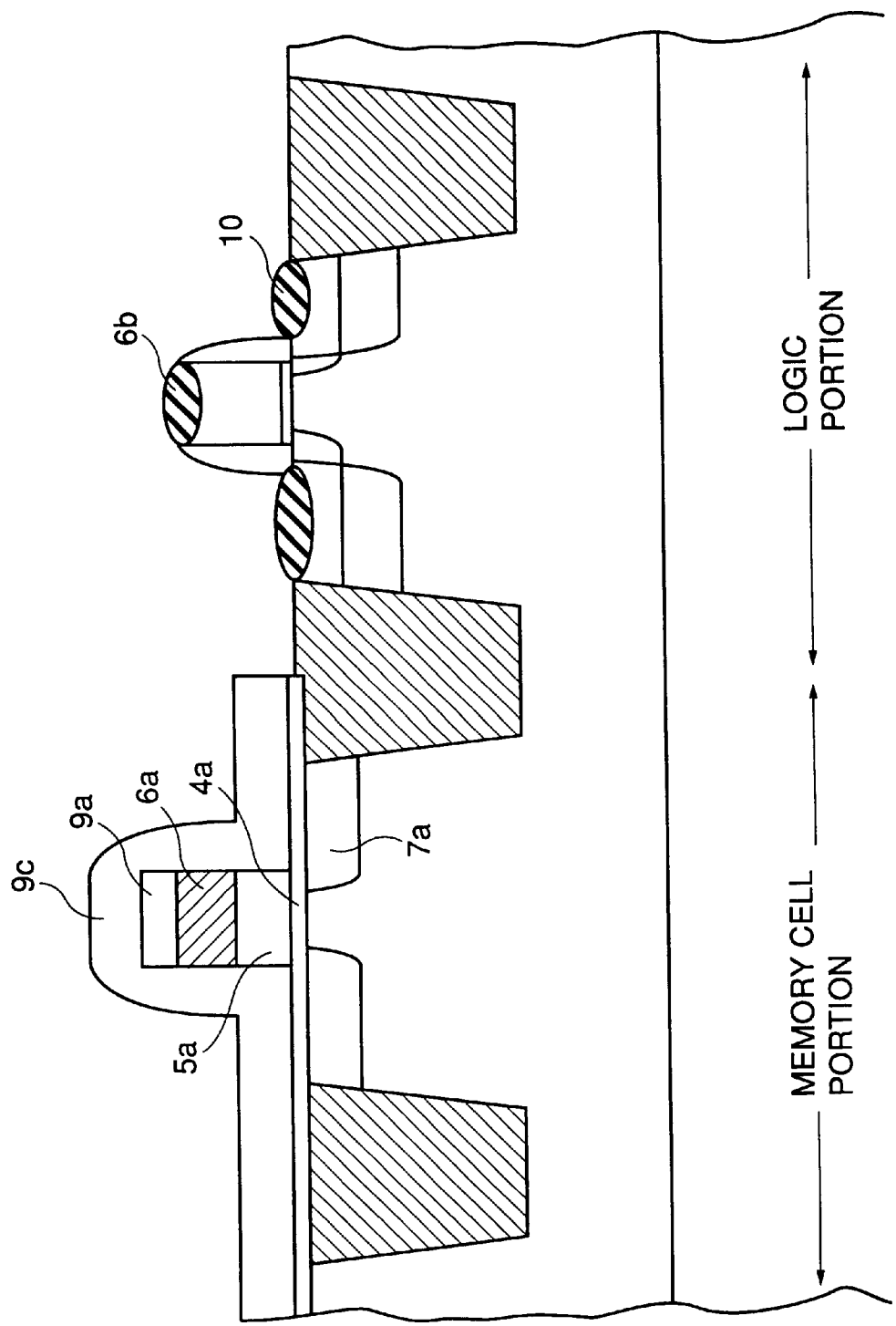

The fourth embodiment is shown in FIG. 13. A structure of films on the gate electrode of the transistor in the memory cell portion in the fourth embodiment is different from those in first and third embodiments. In the first embodiment shown in FIG. 1, for example, silicon nitrided oxide film 9a is formed directly above tungsten silicide 6a constituting the gate electrode of the memory cell portion. As the contraction rate of the silicon nitrided oxide film at the heat treatment is high, adhesion between the silicon nitrided oxide film and the tungsten silicide film is not favorable in the RTA treatment at a high temperature. When silicon oxide film 35 is placed between tungsten silicide film 6a and silicon nitrided oxide film 9a as shown in FIG. 14 as a buffer layer, deterioration of the adhesion characteristic can be suppressed.

In addition, when a silicon nitride film is employed instead of silicon nitrided oxide film 9a, as the silicon nitride film has higher contraction rate at the heat treatment, formation of silicon oxide film 35 is favorable for the improvement of adhesion characteristic.

In the above described embodiments, films and layers are each assumed to be of one material, however, the same effect can be obtained in case another material is employed as described with reference to FIG. 1 of the first embodiment.

The present invention with the above described structure has the following advantages.

According to first and second features of the present invention, a reliable MIS transistor can be obtained because the shape of the gate electrode portion is changed by the oxidation.

Further according to first, second, fifth and sixth features of the present invention, a high performance MIS transistor can be obtained because the P type polycrystalline silicon is employed for the gate electrode of the P type MIS transistor.

Still further, according to a third feature of the present invention, the problem in adhesion characteristic between the silicon nitrided oxide film or the silicon nitride film and the silicide layer constituting the gate electrode will not be caused because the silicon oxide film is placed therebetween. In addition, according to a fourth feature of the present invention, diffusion of boron is suppressed by employing the silicon nitrided oxide film as the gate insulating film of the P type MIS transistor in the logic portion.

Still further, according to fifth and sixth features of the present invention, with the oxidation process, the polycrystalline silicon residue is eliminated and the problem of short circuit will not be caused. In addition, according to the sixth feature of the present invention, the gate electrode in the logic portion is formed after the formation of the gate electrode in the memory cell portion, and hence a leakage current in the memory cell portion can be suppressed.

Still further, according to a seventh feature of the present invention, with lamp anneal, diffusion of the impurity can be suppressed. In addition, according to an eighth feature of the present invention, diffusion of the impurity is further suppressed by the heat treatment at a high temperature.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a memory cell portion and a logic portion formed on a semiconductor substrate;
   a first MIS transistor formed in said memory cell portion;
   a second MIS transistor of a first conductivity type and a third MIS transistor of a second conductivity type formed in said logic portion;
   a gate electrode of said first MIS transistor having a first polycrystalline silicon film and a first silicide layer;
   a gate electrode of said second MIS transistor having a second polycrystalline silicon film of the first conductivity type and a second silicide layer of the first conductivity type; and
   a gate electrode of said third MIS transistor having a third polycrystalline silicon film of the second conductivity type and a second silicide layer of the second conductivity type; wherein
   a gate insulation film of said first MIS transistor being thicker than a gate insulation film of said second MIS transistor and a gate insulation film of said third MIS transistor,
   source/drain active regions of said second MIS transistor and source/drain active regions of said third MIS transistor each having a third silicide layer, and
   sheet resistance of said second silicide layer and said third silicide layer being set lower than sheet resistance of said first silicide layer.

2. The semiconductor device according to claim 1 characterized in that the gate insulation film of said first MIS transistor is thicker at a peripheral portion of said gate electrode than at a central portion of said gate electrode.

3. The semiconductor device according to claim 2 characterized in that a silicon oxide film and a silicon nitrided oxide film, or, a silicon oxide film and silicon nitride film are formed on said first silicide layer of the gate electrode of said first MIS transistor.

4. The semiconductor device according to claim 3 characterized in that the gate insulation film of said third MIS transistor is a silicon nitrided oxide film.

5. The semiconductor device according to claim 1 characterized in that the gate insulation film of said second MIS transistor and the gate insulation film of said third MIS transistor are thicker at a peripheral portion of said gate electrode than at a central portion of said gate electrode.

6. The semiconductor device according to claim 5 characterized in that a silicon oxide film and silicon nitrided oxide film, or, a silicon oxide film and silicon nitride film are formed on said first silicide layer of the gate electrode of said first MIS transistor.

7. The semiconductor device according to claim 6 characterized in that the gate insulation film of said third MIS transistor is a silicon nitrided oxide film.

8. A method of manufacturing a semiconductor device with a memory cell portion and a logic portion on a semiconductor substrate, having first MIS transistor formed in said memory cell portion, a second MIS transistor of a first conductivity type and a third MIS transistor of a second conductivity type formed in said logic portion, a gate electrode of said first MIS transistor, having a first polycrystalline silicon film and a first silicide layer, a gate electrode of said second MIS transistor, having a second polycrystalline silicon film and a second silicide layer, a gate electrode of said third MIS transistor, having a third polycrystalline silicon film and a second silicide layer, and source/drain active regions of said second MIS transistor and the third MIS transistor, having a third silicide layer, sheet resistance of the second silicide layer and sheet resistance of the third silicide layer being lower than sheet resistance of said first silicide layer, and a gate insulation film of said first MIS transistor being thicker than a gate insulation film of said second MIS transistor and a gate insulation film of the third MIS transistor, said method comprising the steps of:

forming the gate insulation film of said second MIS transistor, the gate insulation film of the third MIS transistor, said second polycrystalline silicon film and the third polycrystalline silicon film, and forming patterns of the gate insulation film of said second MIS transistor and the gate insulation film of the third MIS transistor;

forming sidewalls of said second MIS transistor and the third MIS transistor;

forming the gate insulation film of said first MIS transistor, said first polycrystalline silicon film and the first silicide film, and forming a pattern of the gate electrode of said first MIS transistor;

oxidizing a polycrystalline silicon residue produced in forming the pattern of the gate electrode of said first MIS transistor and a surface of said semiconductor substrate;

forming an insulation film covering the gate electrode of said first MIS transistor; and turning the gate electrode of said second MIS transistor, the gate electrode and the source/drain active regions of the third MIS transistor into a silicide.

9. The method of manufacturing the semiconductor device according to claim 8, wherein said step of oxidizing said polycrystalline silicon residue and the surface of said semiconductor substrate includes a step of performing lamp anneal.

10. A method of manufacturing a semiconductor device with a memory cell portion and a logic portion on a semiconductor substrate, having a first MIS transistor formed on said memory cell portion, a second MIS transistor of a first conductivity type and a third MIS transistor of a second conductivity type formed in said logic portion, a gate electrode of said first MIS transistor, having a first polycrystalline silicon film and a first silicide layer, a gate electrode of said second MIS transistor, having a second polycrystalline silicon film and a second silicide layer, and a gate electrode of said third MIS transistor, having a third polycrystalline silicon film and a second silicide layer, and source/drain active regions of said second MIS transistor and the third MIS transistor, having a third silicide layer, sheet resistance of the second silicide layer and sheet resistance of the third silicide layer being lower than sheet resistance of said first silicide layer, and a gate insulation film of said first MIS transistor being thicker than a gate insulation film of said second MIS transistor and a gate insulation film of said third MIS transistor, said method comprising:

forming the gate insulation film of said first MIS transistor and said first polycrystalline silicon film and a first silicide film, and forming a pattern of the gate electrode of said first MIS transistor;

forming an insulation film covering the gate electrode of said first MIS transistor;

forming the gate insulation film of said second MIS transistor, the gate insulation film of the third MIS transistor, the second polycrystalline silicon film and the third polycrystalline silicon film, and forming patterns of the gate electrode of said second MIS transistor and the gate electrode of the third MIS transistor;

oxidizing a polycrystalline silicon residue produced in forming the patterns of the gate electrode of said second MIS transistor and the gate electrode of the third MIS transistor and a surface of said semiconductor substrate;

forming sidewalls of said second MIS transistor and the third MIS transistor; and turning the gate electrode and the source/drain active regions of said second MIS transistor, and the gate electrode and the source/drain active regions of the third MIS transistor into a silicide.

11. The method of manufacturing the semiconductor device according to claim 10, wherein the step of oxidizing said polycrystalline silicon residue and the surface of said semiconductor substrate includes a step of performing lamp anneal.

12. The method of manufacturing the semiconductor device according to claim 11, wherein said lamp anneal is performed at a temperature of at least 1000° C.

* * * * *